(12) United States Patent
Huang et al.

(10) Patent No.: US 10,680,059 B2
(45) Date of Patent: Jun. 9, 2020

(54) HIGH VOLTAGE METAL OXIDE SEMICONDUCTOR DEVICE AND MANUFACTURING METHOD THEREOF

(71) Applicant: RICHTEK TECHNOLOGY CORPORATION, Zhubei, Hsinchu (TW)

(72) Inventors: Tsung-Yi Huang, Hsinchu (TW); Chu-Feng Chen, Hsinchu (TW)

(73) Assignee: RICHTEK TECHNOLOGY CORPORATION, Zhubei, Hsinchu (TW)

(*) Notice: Subject to any disclaimer, the term of this patent is extended or adjusted under 35 U.S.C. 154(b) by 0 days.

(21) Appl. No.: 16/130,921

(22) Filed: Sep. 13, 2018

(65) Prior Publication Data

US 2019/0131390 A1 May 2, 2019

(30) Foreign Application Priority Data

Oct. 26, 2017 (TW) .............................. 106136957 A

(51) Int. Cl.
| | | |
|---|---|---|
| H01L 29/10 | (2006.01) | |
| H01L 29/78 | (2006.01) | |
| H01L 29/66 | (2006.01) | |
| H01L 29/06 | (2006.01) | |
| H01L 29/423 | (2006.01) | |

(52) U.S. Cl.
CPC ...... H01L 29/0623 (2013.01); H01L 29/0634 (2013.01); H01L 29/1054 (2013.01); H01L 29/1095 (2013.01); H01L 29/66659 (2013.01); H01L 29/66681 (2013.01); H01L 29/66689 (2013.01); H01L 29/7816 (2013.01); H01L 29/7835 (2013.01); H01L 29/0692 (2013.01); H01L 29/42368 (2013.01)

(58) Field of Classification Search
CPC ............. H01L 29/7833; H01L 29/7834; H01L 29/66681; H01L 29/0623
USPC .................................................. 257/339, 343
See application file for complete search history.

(56) References Cited

U.S. PATENT DOCUMENTS

| | | | | |
|---|---|---|---|---|
| 2006/0284276 A1* | 12/2006 | Yilmaz | ............... | H01L 29/0634 257/492 |
| 2010/0123171 A1* | 5/2010 | Yang | .................... | H01L 27/0733 257/272 |
| 2014/0217501 A1* | 8/2014 | Sulistyanto | ......... | H01L 29/7816 257/343 |
| 2016/0315188 A1* | 10/2016 | Disney | ................ | H01L 29/7816 |

(Continued)

*Primary Examiner* — David Vu
*Assistant Examiner* — Brandon C Fox
(74) *Attorney, Agent, or Firm* — Tung & Associates

(57) ABSTRACT

A high voltage MOS device includes: a well, a drift region, a gate, a source, a drain, and plural buried columns. A part of the gate is stacked on a part of the well, and another part of the gate is stacked on a part of the drift region. The source connects the well in a lateral direction. The drain connects the drift region in the lateral direction. The drain and the source are separated by the well and the drift region, and the drain and the source are located at different sides of the gate. The plural buried columns are formed beneath the top surface by a predetermined distance, and each buried column does not connect the top surface. At least a part of every buried column is surrounded by the drift region, and the buried columns and the drift region are arranged in an alternating manner.

18 Claims, 11 Drawing Sheets

(56) References Cited

U.S. PATENT DOCUMENTS

2019/0006460 A1\* 1/2019 Chiu .................. H01L 23/5228
2019/0096988 A1\* 3/2019 Murukesan ........... H01L 29/063

\* cited by examiner

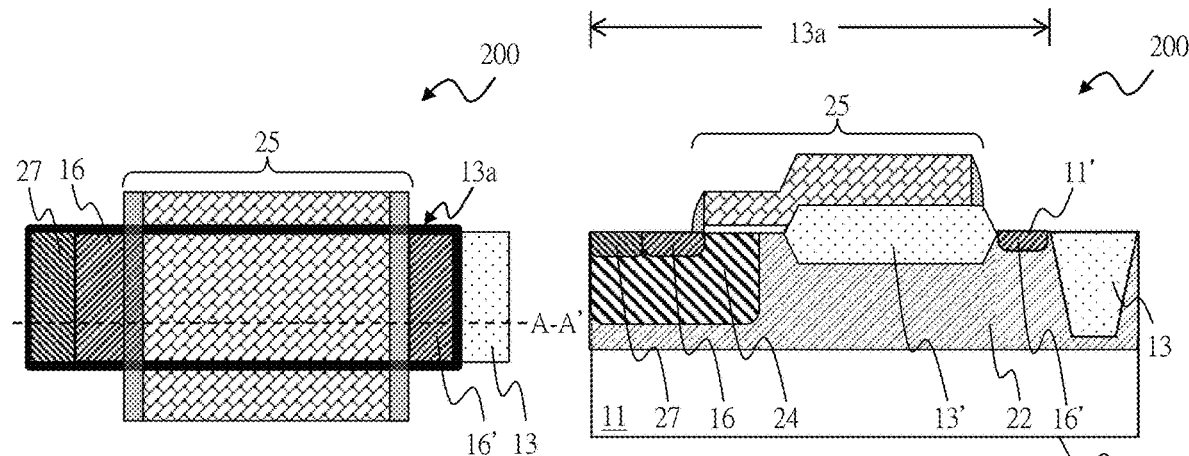
Fig. 2A (prior art)
Fig. 2B (prior art)
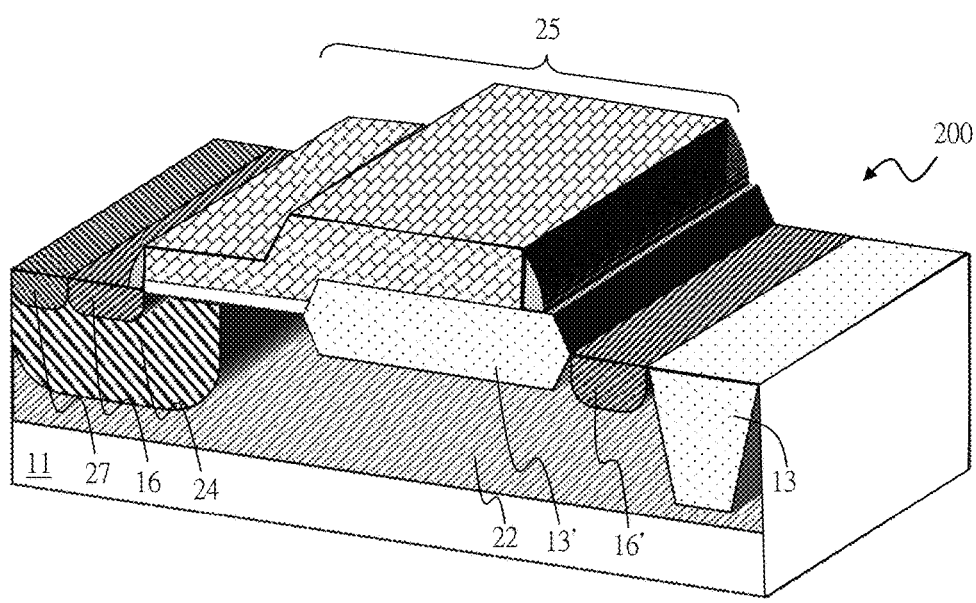
Fig. 2C (prior art)

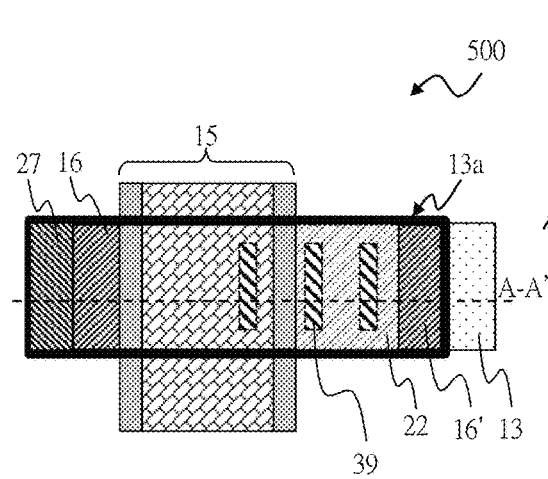
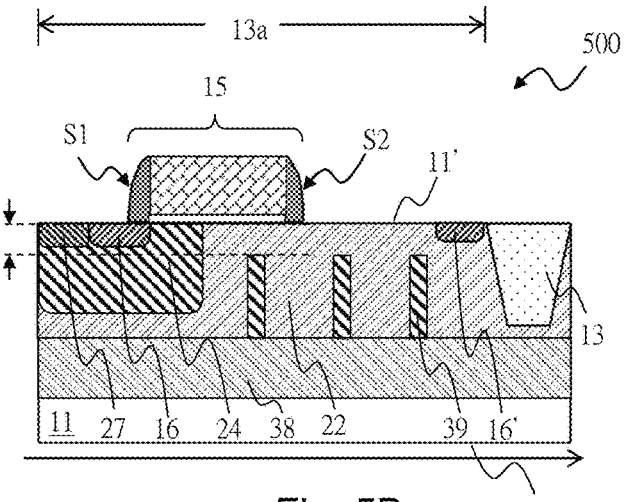
Fig. 5A  Fig. 5B
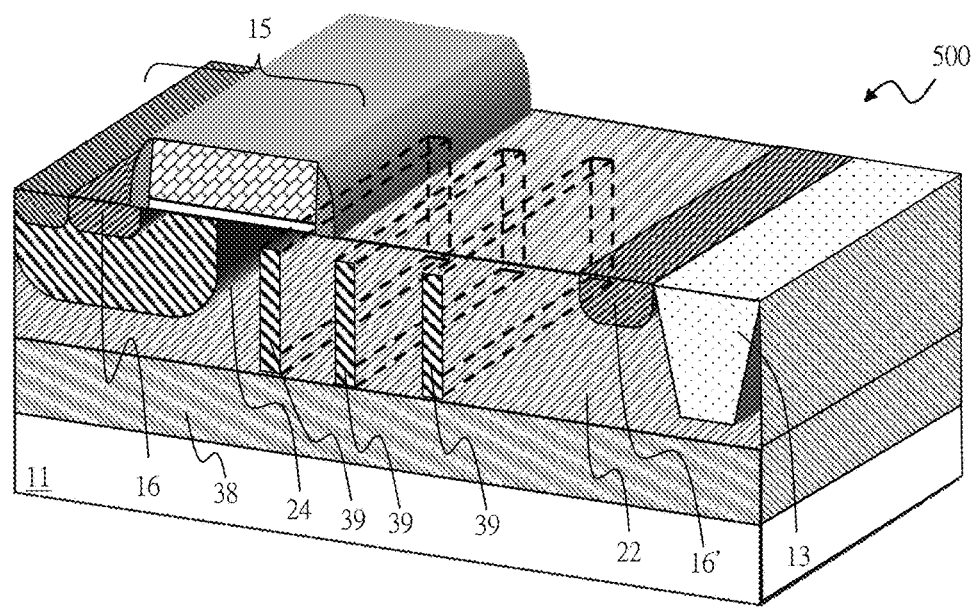
Fig. 5C

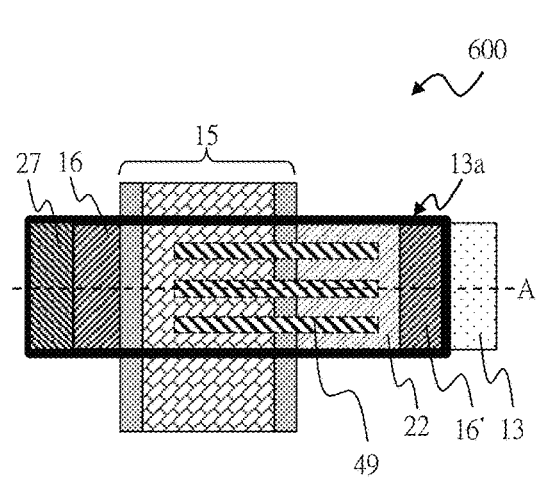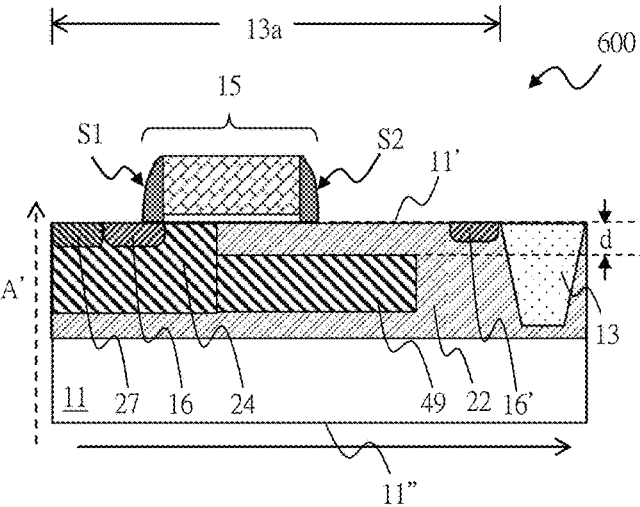
Fig. 6A  Fig. 6B
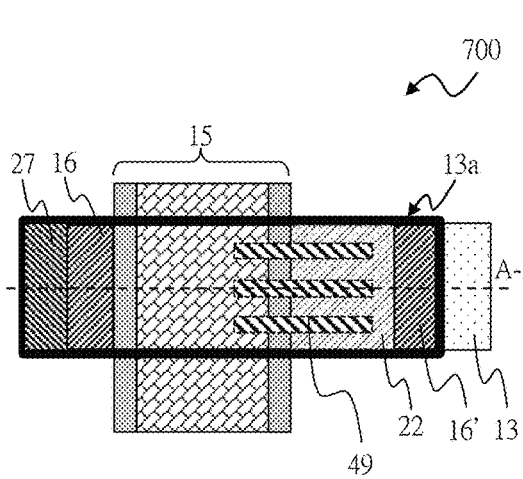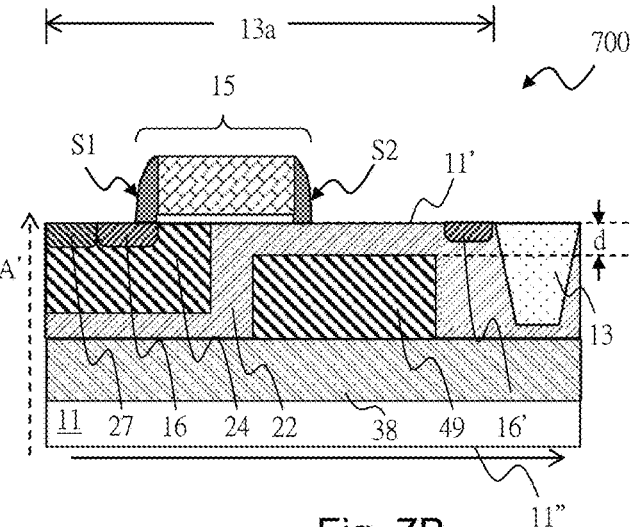
Fig. 7A  Fig. 7B

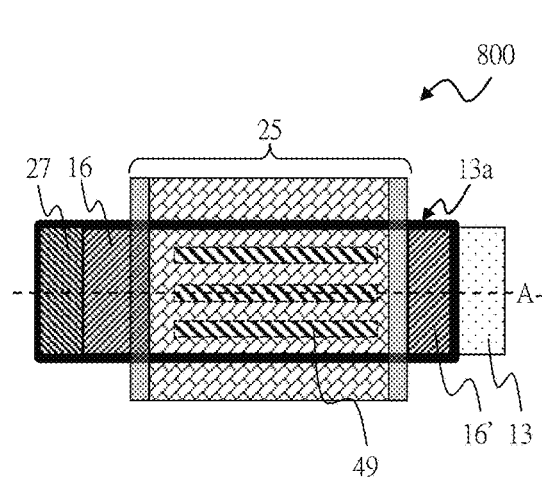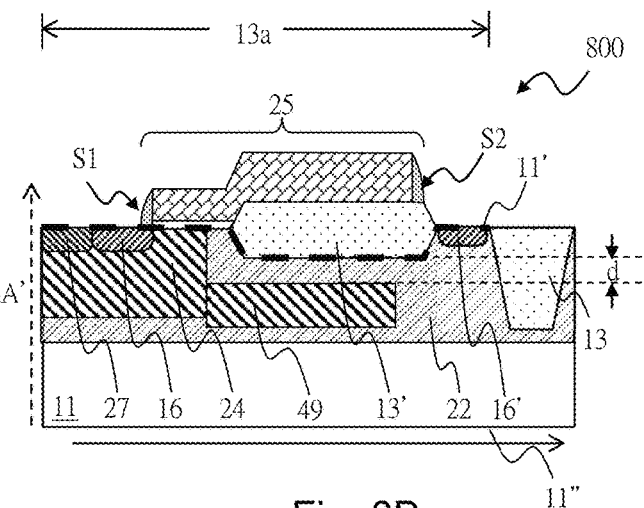
Fig. 8A Fig. 8B
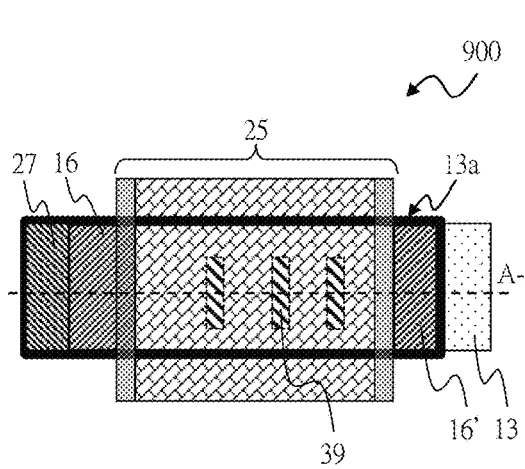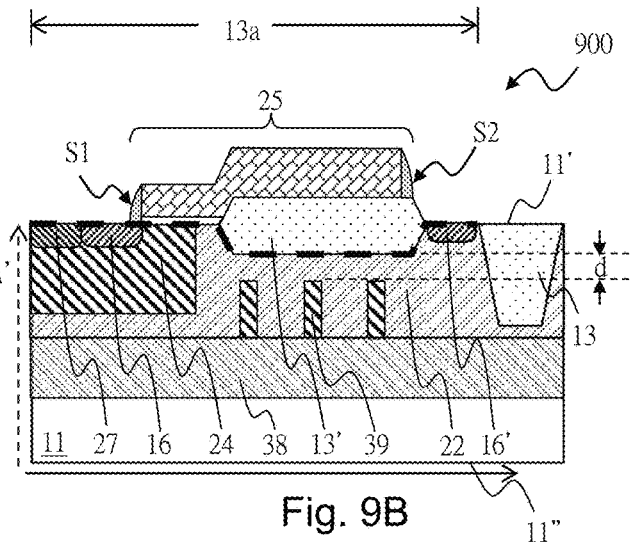
Fig. 9A Fig. 9B

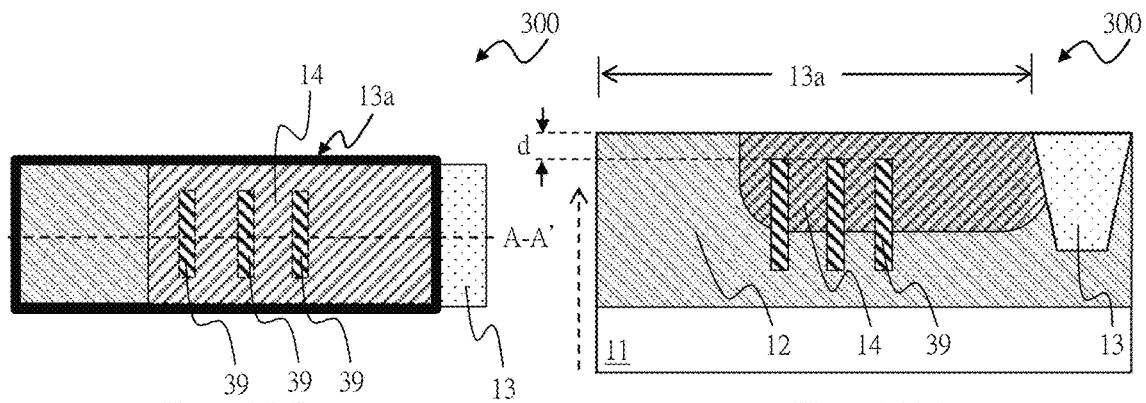
Fig. 10G
Fig. 10H
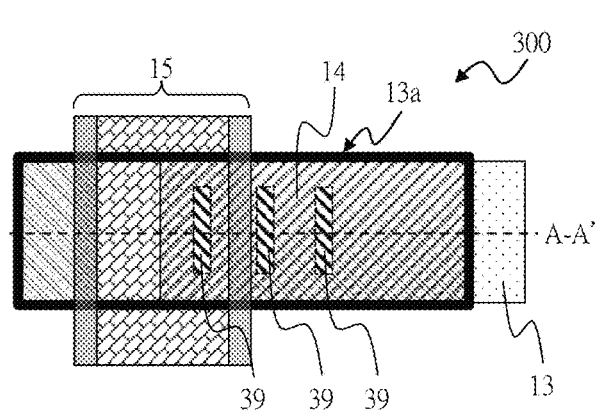
Fig. 10I
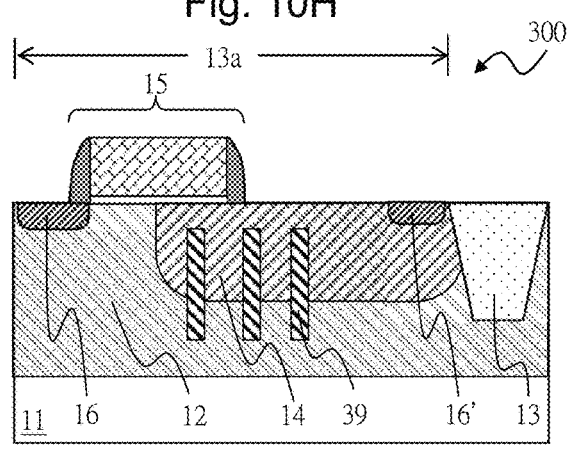
Fig. 10J
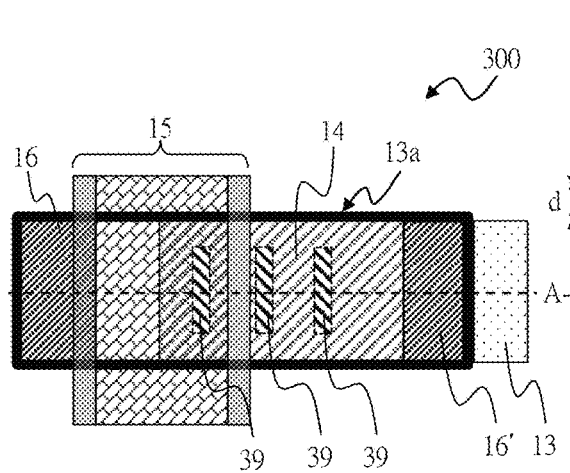
Fig. 10K
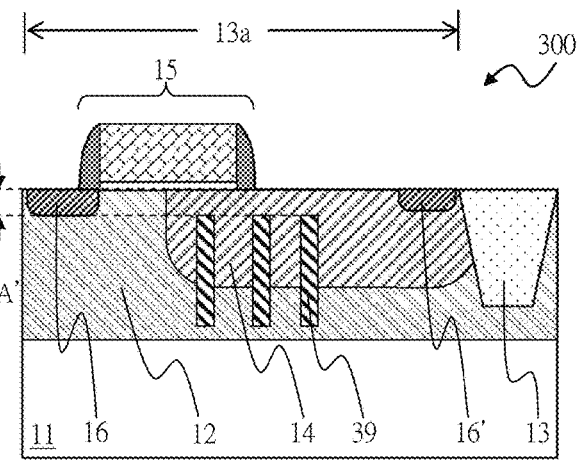
Fig. 10L

US 10,680,059 B2

HIGH VOLTAGE METAL OXIDE SEMICONDUCTOR DEVICE AND MANUFACTURING METHOD THEREOF

CROSS REFERENCES

The present invention claims priority to TW 106136957 filed on Oct. 26, 2017.

BACKGROUND OF THE INVENTION

Field of Invention

The present invention relates to a high voltage metal oxide (MOS) semiconductor device; particularly, it relates to a high voltage MOS device having increased breakdown voltage without sacrificing its on-resistance. The present invention also relates to a manufacturing method of such a high voltage MOS semiconductor device.

Description of Related Art

FIGS. 1A, 1B, and 1C show a top view, a cross-section view and a perspective view of a prior art high voltage metal oxide semiconductor device (N-type high voltage MOS device 100), respectively. As shown in FIGS. 1A, 1B, and 1C, the high voltage MOS device 100 is formed on a semiconductor substrate 11, and the semiconductor substrate 11 has a top surface 11' and a bottom surface 11" opposite to the top surface 11' in the vertical direction. The high voltage MOS device 100 includes: a P well region 12, an isolation oxide region 13, an N-type drift region 14, a gate 15, an N-type source 16, and an N-type drain 16'.

FIGS. 2A, 2B, and 2C show a top view, a cross-section view and a perspective view of another prior art high voltage metal oxide semiconductor device (N-type high voltage MOS device 200), respectively. As shown in FIGS. 2A, 2B, and 2C, the high voltage MOS device 200 is formed on the semiconductor substrate 11. The high voltage MOS device 200 includes a P-type well region 22, an isolation oxide region 13, an isolation oxide region 13', a body region 24, a gate 25, a source 16, a drain 16', and a body electrode 27.

The prior art devices shown in FIGS. 1A, 1B, and 1C and FIGS. 2A, 2B, and 2C have a drawback that their on-resistance and breakdown voltage have to trade-off with each other, causing a dilemma. That is, increasing the breakdown voltage will increase the on-resistance; lowering the on-resistance will reduce the breakdown voltage. Such a situation in the high voltage MOS devices is well known to a person having ordinary skill in the art, so the details thereof are not redundantly explained here.

Compared with the prior art of FIGS. 1A, 1B and 1C and FIGS. 2A, 2B and 2C, the present invention can improve the breakdown voltage without sacrificing the on-resistance, thereby reducing the cost of the device, improving the performance of the device, and expanding the application range of the device.

SUMMARY OF THE INVENTION

From one perspective, the present invention provides a high voltage metal oxide semiconductor (MOS) device formed on a semiconductor substrate having a top surface and a bottom surface that is opposite to the top surface in a vertical direction, the high voltage MOS device comprising: a well region having a first conductivity type, wherein the well region is formed beneath the top surface, and connects the top surface in the vertical direction; a drift region having a second conductivity type, wherein the drift region is formed beneath the top surface and connects the top surface in the vertical direction, the drift region being located completely in the well region, and the drift region connecting the well region in a lateral direction and in the vertical direction; a gate formed on the top surface, wherein a part of the gate is stacked on and connects a part of the well region in the vertical direction, and another part of the gate is stacked on and connects a part of the drift region in the vertical direction; a source having the second conductivity type, wherein the source is formed beneath the top surface and contacts the top surface in the vertical direction and contacts the well region in the lateral direction, the source being located beneath a first side of the gate and contacts a portion of the gate; a drain having the second conductivity type, wherein the drain is formed beneath the top surface and contacts the top surface in the vertical direction and contacts the well region in the lateral direction, and wherein the drain and the source are separated by the well and the drift region, the drain being located away from a second side of the gate by a lateral distance, and the drain and the source are located at different sides of the gate in the lateral direction; a plurality of buried columns having the second conductivity type, wherein the buried columns are formed beneath the top surface by a predetermined distance and do not contact with the top surface, and wherein at least a part of every buried column is surrounded by the drift region so that the buried columns and the drift region are arranged in an alternating manner.

In one preferable embodiment, the high voltage MOS device further includes: a deep well region having the first conductivity type, the deep well being formed beneath the well region and the drift region, and the deep well region connects the buried columns in the vertical direction.

In one preferable embodiment, the buried columns and the drift region between the well region and the drain are completely depleted during an OFF operation of the high voltage MOS device.

In one preferable embodiment, the predetermined distance is longer than 0.1 micrometer (μm).

From another perspective, the invention present invention provides a manufacturing method of a high voltage MOS semiconductor device, comprising: providing a substrate having a top surface and a bottom surface opposite to the top surface in a vertical direction; forming a well region having a first conductivity type beneath the top surface, wherein the well region connects the top surface; forming a drift region having a second conductivity type beneath the top surface, wherein the drift region connects the top surface, and the drift region is located completely in the well region and connects the well region in a lateral direction and in the vertical direction; forming a gate on the top surface, wherein a part of the gate is stacked on and connects a part of the well region and another part of the gate is stacked on and connects a part of the drift region; forming a source having the second conductivity type beneath the top surface, wherein the source contacts the top surface in the vertical direction and contacts the well region in the lateral direction, the source being located beneath a first side of the gate and contacts a portion of the gate; forming a drain having the second conductivity type beneath the top surface, wherein the drain contacts the top surface in the vertical direction and contacts the well region in the lateral direction, and wherein the drain and the source are separated by the well and the drift region, the drain being located away from a second side of the gate by a lateral distance, and the drain and the source are located at different sides of the gate in the lateral direction; and forming a plurality of buried columns having the second conductivity type, wherein the buried columns are formed beneath the top surface by a predetermined distance and do not contact with the top surface, and wherein at least a part of every buried column is surrounded by the drift region so that the buried columns and the drift region are arranged in an alternating manner.

In one preferable embodiment, the method further includes: forming a deep well region beneath the well region and the drift region, wherein the deep well region has a first conductivity type and the deep well region connects the buried columns.

In one preferable embodiment, the buried columns and the drift region between the well region and the drain are completely depleted during an OFF operation of the high voltage MOS device.

In one preferable embodiment, the predetermined distance is longer than 0.1 micrometer (μm).

From another perspective, the present invention provides a high voltage metal oxide semiconductor (MOS) device formed on a semiconductor substrate having a top surface and a bottom surface that is opposite to the top surface in a vertical direction, the high voltage MOS comprising: a body region having a first conductivity type, wherein the body region is formed beneath the top surface and connects the top surface; a drift well region having a second conductivity type, wherein the drift well region is formed beneath the top surface and connects the top surface, the body region being located completely in the drift well region and the body region connecting the drift well region in a lateral direction and in the vertical direction; a gate formed on the top surface, wherein a part of the gate is stacked on and connects a part of the well region in the vertical direction, and another part of the gate is stacked on and connects a part of the drift well region in the vertical direction; a source having the second conductivity type, wherein the source is formed beneath the top surface and contacts the top surface in the vertical direction, and the source contacts body region in the lateral direction, the source being located beneath a first side of the gate and contacts a portion of the gate; a drain having the second conductivity type, wherein the drain is formed beneath the top surface and contacts the top surface in the vertical direction, and the drain contacts the drift well region in the lateral direction, the drain and the source being separated by the well and the drift region, and the drain being located away from a second side of the gate by a lateral distance, wherein the drain and the source are located at different sides of the gate in the lateral direction; and a plurality of buried columns having the first conductivity type, wherein the buried columns are formed beneath the top surface by a predetermined distance and do not contact with the top surface, and wherein at least part of every buried column is surrounded by the drift well region so that the buried columns and the drift region are arranged in an alternating manner.

In one preferable embodiment, the high voltage MOS device further includes a deep well region having the first conductivity type, which is formed beneath the drift well region, and the deep well region connects the buried column in the vertical direction.

In one preferable embodiment, the high voltage MOS device further includes a field oxide region formed on the top surface, wherein a part of the gate is stacked on and connects a part of the field oxide region in the vertical direction.

In one preferable embodiment, the high voltage MOS device further includes a body electrode having the first conductivity type, which is formed beneath the top surface and connects the top surface and the body region in the vertical direction, and the body electrode is provided as an electrical contact for the body region.

In one preferable embodiment, the buried columns and the drift well region between the body region and the drain are completely depleted during an OFF operation of the high voltage MOS device.

In one preferable embodiment, the predetermined distance is longer than 0.1 micrometer (μm).

From another perspective, the present invention a manufacturing method of a high voltage MOS semiconductor device, comprising: providing a substrate having a top surface and a bottom surface opposite to the top surface in a vertical direction; forming a body region having a first conductivity type beneath the top surface, wherein the body region connects the top surface; forming a drift well region having a second conductivity type beneath the top surface, wherein the drift well region connects the top surface and the body region is located completely in the drift well, the drift well region connecting the body region in a lateral direction and in the vertical direction; forming a gate on the top surface, wherein a part of the gate is stacked on and connects a part of the body region and another part of the gate is stacked on and connects a part of the drift well region; forming a source having the second conductivity type beneath the top surface, wherein the source contacts the top surface in the vertical direction and contacts the body region in the lateral direction, the source being located beneath a first side of the gate and contacts a portion of the gate; forming a drain having the second conductivity type beneath the top surface, wherein the drain contacts the top surface in the vertical direction and contacts the drift well region in the lateral direction, the drain and the source being separated by the well and the drift region, and the drain being located away from a second side of the gate by a lateral distance, wherein the drain and the source are located at different sides of the gate in the lateral direction; and forming a plurality of buried columns having the first conductivity type beneath the top surface by a predetermined distance, wherein the buried columns do not contact with the top surface, and wherein at least a part of every buried column is surrounded by the drift well region so that the buried columns and the drift well region are arranged in an alternating manner.

In one preferable embodiment, the method further includes: forming a deep well region beneath the drift well, wherein the deep well region has a first conductivity type and connects the buried columns.

In one preferable embodiment, the method further includes: forming a field oxide region on the top surface, wherein a part of the gate is stacked on and connects a part of the field oxide region.

In one preferable embodiment, the method further includes: forming a body electrode, wherein the body electrode is formed beneath the top surface and connects the top surface and the body region, and the body electrode is provided as an electrical contact for the body region.

In one preferable embodiment, the buried columns and the drift well region between the well region and the drain are completely depleted during an OFF operation of the high voltage MOS device.

The objectives, technical details, features, and effects of the present invention will be better understood with regard to the detailed description of the embodiments below.

BRIEF DESCRIPTION OF THE DRAWINGS

FIGS. 2A to 2C respectively show a top view, a cross-section view and a perspective view of another prior art high voltage metal oxide semiconductor device.

FIGS. 5A to 5C show a third embodiment of the present invention.

FIGS. 6A and 6B show a fourth embodiment of the present invention.

FIGS. 7A and 7B show a fifth embodiment of the present invention.

FIGS. 8A and 8B show a sixth embodiment of the present invention.

FIGS. 9A and 9B show a seventh embodiment of the present invention.

FIGS. 10A to 10L show an eighth embodiment of the present invention.

DESCRIPTION OF THE PREFERABLE EMBODIMENTS

The drawings as referred to throughout the description of the present invention are for illustration only, to show the interrelations among the process steps, the layers, but the shapes, thicknesses, and widths are not drawn in actual scale.

Figures 1A, 1B:
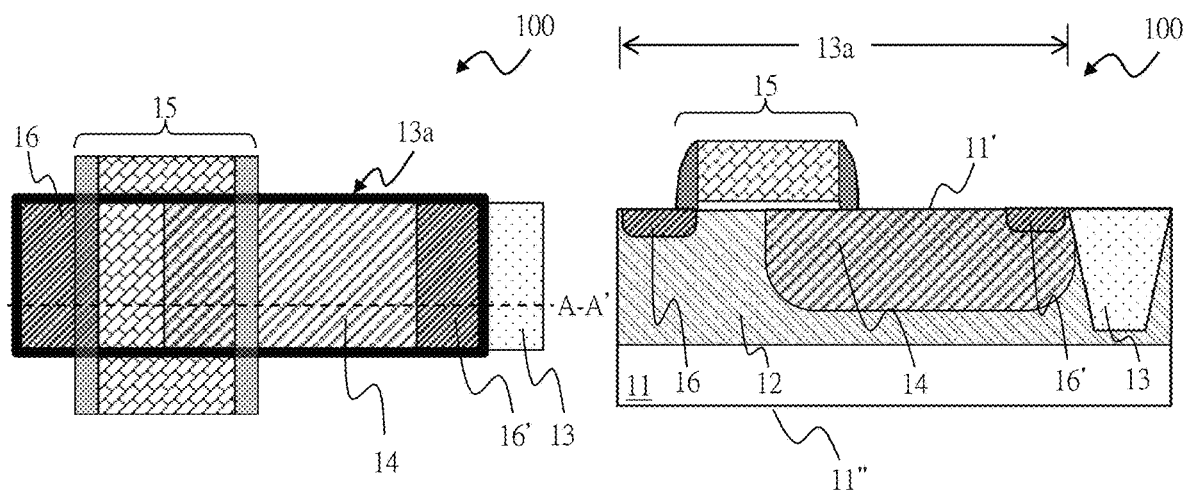
FIGS. 1A to 1C respectively show a top view, a cross-section view and a perspective view of a prior art high voltage metal oxide semiconductor device.
Figure 1C:
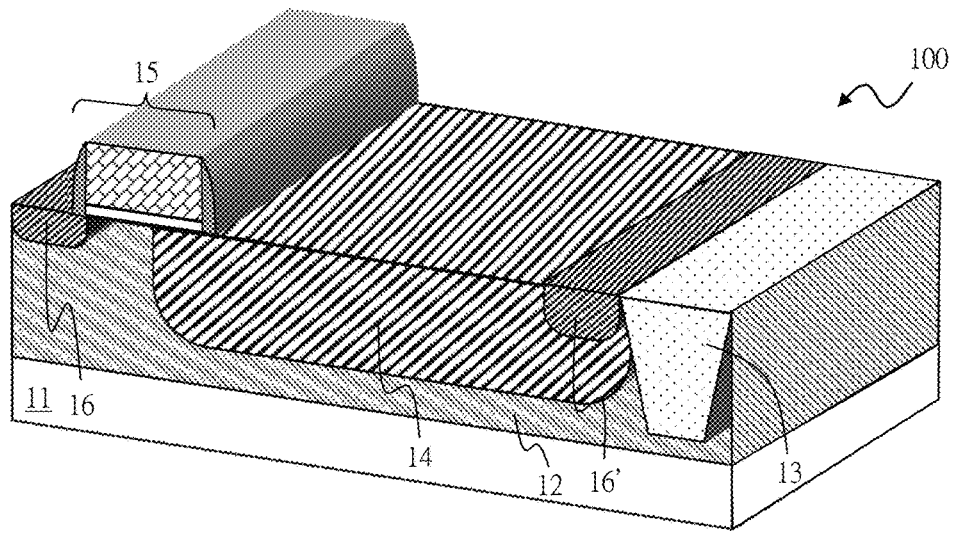
Figure 3A:
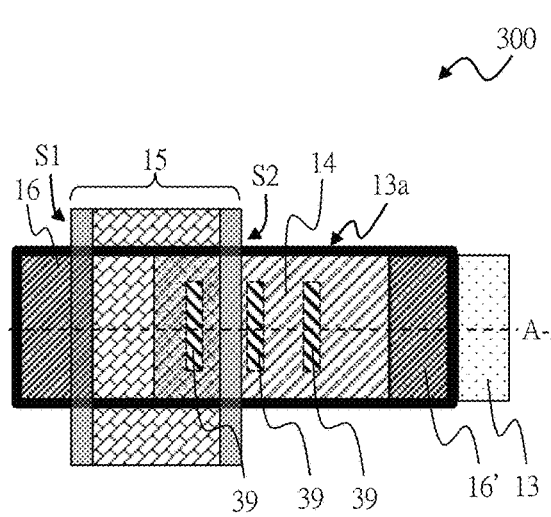
FIGS. 3A to 3C show a first embodiment of the present invention.
Figure 3B:
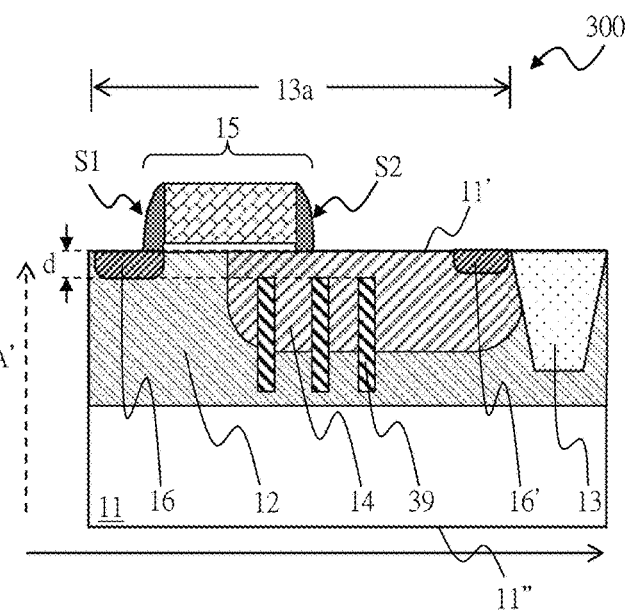
Figure 3C:
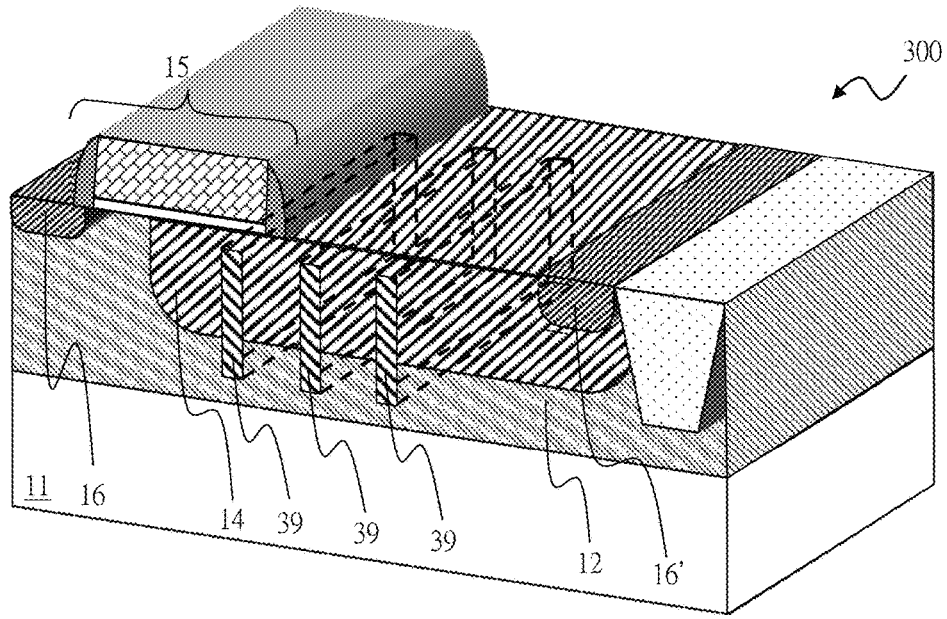

Please refer to FIGS. 3A-3C, which respectively show a top view, a cross-section view (FIG. 3B corresponds to the cross-section line A-A' in FIG. 3A), and a perspective view of an embodiment of a high voltage metal oxide semiconductor device according to the present invention (high voltage MOS device 300). As shown in FIGS. 3A, 3B and 3C, the high voltage MOS device 300 is formed on a semiconductor substrate 11 having a top surface 11' and a bottom surface 11" that is opposite to the top surface 11 in a vertical direction (as indicated by the direction of the dashed arrow in FIG. 3B). The high voltage MOS device 300 includes a well region 12, an isolation oxide region 13, a drift region 14, a gate 15, a source 16, a drain 16', and plural buried columns 39. The gate 15 includes a gate conductive layer, a gate dielectric layer, and a spacer layer.

Still referring to FIGS. 3A, 3B and 3C, the well region 12 which has a first conductivity type is formed in the semiconductor substrate 11; the well region 12 is located beneath the top surface 11' and connects the top surface 11' in the vertical direction. The isolation oxide region 13 is formed on the top surface 11' for defining an operation region 13a of the high voltage MOS device 300. The drift region 14 has a second conductivity type, and is located beneath the top surface 11' and connects the top surface 11' in the vertical direction; the drift region 14 is located completely in the well region 12, and the drift region 14 connects the well region 12 in a lateral direction (as indicated by the direction of the solid arrow in FIG. 3B) and in the vertical direction. The gate 15 is formed on the top surface 11', wherein a part of the gate 15 is stacked on and contacts a portion of the well region 12, and another part of the gate 15 is stacked on a part of the drift region 14 in the vertical direction. Note that the channel region of the high voltage MOS device 300 is the portion of the well region 12 below the gate 15. The source 16 which has a second conductivity type is formed beneath the top surface 11' and contacts the top surface 11' in the vertical direction; the source 16 contacts the well region 12 in the lateral direction, and is located beneath a first side S1 of the gate 15 and contacts a portion of the gate 15 (the spacer layer in this embodiment). The drain 16' which has a second conductivity type is formed beneath the top surface 11' and contacts the top surface 11' in the vertical direction, and the drain 16' contacts the drift region 14 in the lateral direction. The drain 16' and the source 16 are separated by the well region 12 and the drift region 14. The drain 16' is located outside of a second side S2 of the gate 15 and is away from the second side S2 of the gate 15 by a distance in the lateral direction; the drain 16' and the source 16 are at different sides of the gate 15 in the lateral direction.

Still referring to FIGS. 3A, 3B and 3C, the buried columns 39 which have a first conductivity type are formed at locations below the top surface 11' by a predetermined distance d and do not contact with the top surface 11' in the vertical direction. As shown in the figures, at least a part of every buried column 39 is surrounded by the drift region 14 so that the buried columns 39 and the drift region 14 are arranged in an alternating manner. In a preferable embodiment, the buried columns 39 and the drift region 14 between the well region 12 and the drain 16' are completely depleted during OFF operation of the device.

One of the technical features of the present invention superior to the prior art is that, according to the present invention, taking the high-voltage MOS device 300 as an example, when the buried columns 39 of the first conductive type and the drift region 14 of the second conductive type have a high reverse bias voltage, a super junction can be generated by the depletion effect of two adjacent buried columns 39 and the drift region 14 in between, that is, the two adjacent buried columns 39 and the drift region 14 in between are all turned into a depletion region, so that the device can withstand a higher voltage and the breakdown voltage of the device can be increased; on the other hand, because there is a predetermined distance d between the buried columns 39 and the top surface 11', the conduction current of the high voltage MOS device 300 during ON operation is not lowered by the buried columns 39, i.e., the on-resistance is unaffected. In brief, compared with the prior art, the breakdown voltage of the high voltage MOS device 300 of the present invention can be increased without sacrificing the on-resistance. Preferably, the buried columns 39 are electrically connected with and in contact with the well region 12, or the buried columns 39 are biased by the well region 12. In a preferable embodiment, the predetermined distance d is longer than 0.1 micrometer (μm).

A region or layer of "first conductivity type" or "second conductivity type" mean that impurities of the conductivity type are doped in the region or layer (for example but not limited to the aforementioned drift region, body region, body connection region, source, drain, gate, etc.) so that the region has the first or second conductivity type; the first conductivity type is for example N-type and the second conductivity type is P-type, or the opposite. The top surface 11' refers to an upper edge of the semiconductor substrate 11 in the vertical direction, where a major part of a conduction current flows along. Although the original semiconductor substrate may have a flat top surface, due to formation of various parts of the high voltage MOS device such as the isolation oxide region, the topology of the top surface 11' is uneven.

The so-called "high-voltage MOS device" means that an voltage applied to the drain during normal operation is higher than a specific voltage, such as 5V or higher; in this embodiment, the drain 16' of the high-voltage MOS device is separated from the channel region by the drift region 14, and the lateral distance between the drift region 14 and the drain 16' is designed according to the required operation voltage, so that the device can be operated at the aforementioned higher voltage.

Figures 4A, 4B:
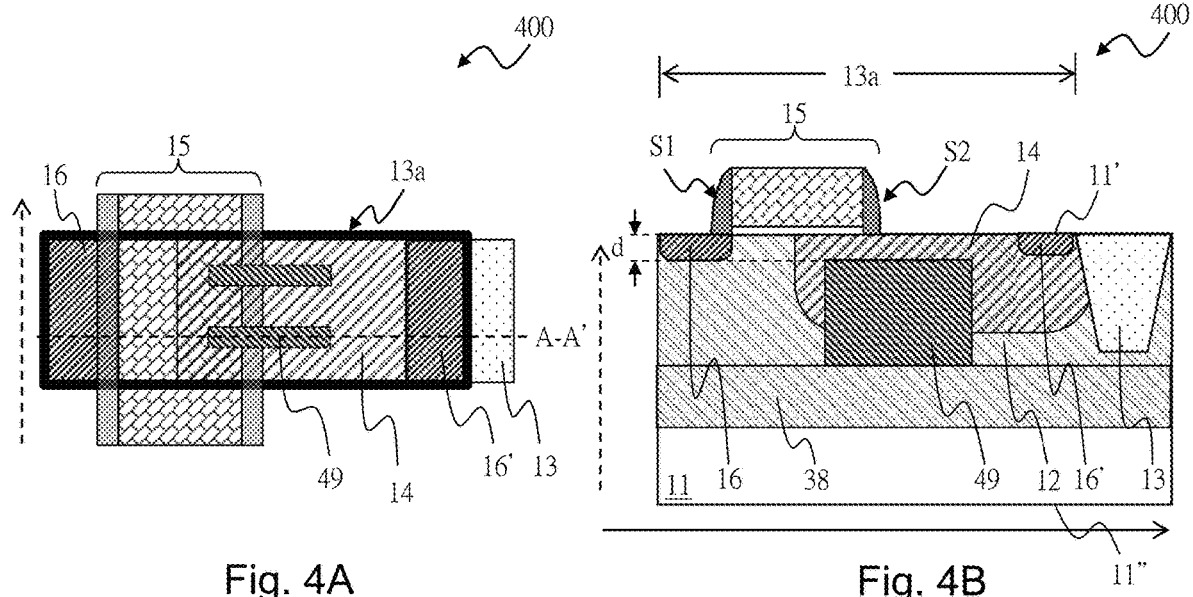
FIGS. 4A to 4C show a second embodiment of the present invention.
Figure 4C:
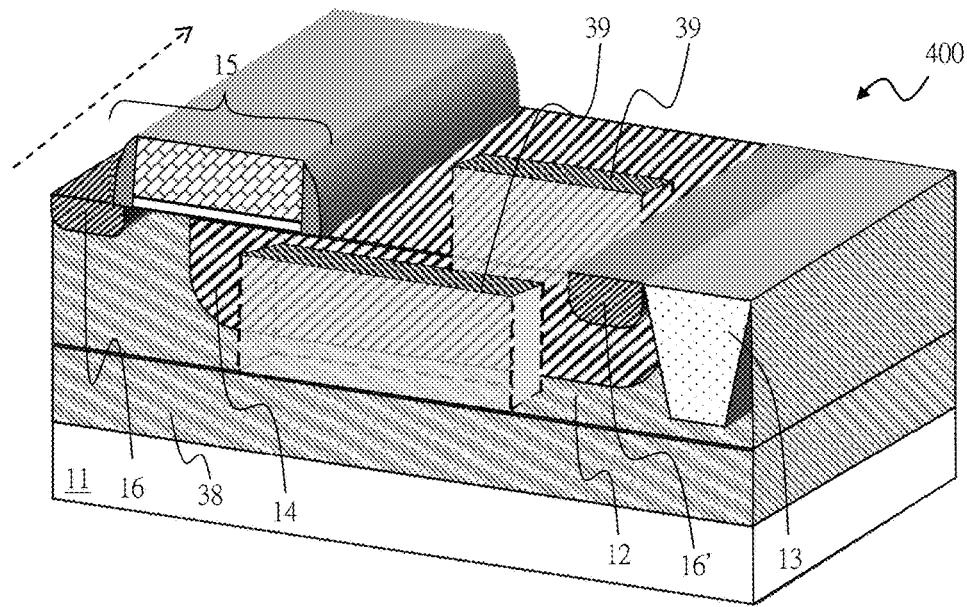

FIGS. 4A-4C show a second embodiment of the present invention. FIGS. 4A-4C are respectively a top view, a cross-section view (FIG. 4B corresponds to the cross-section line A-A' in FIG. 4A) and a perspective view of an embodiment of the high voltage metal oxide semiconductor device according to the present invention (high voltage MOS device 400). As shown in FIGS. 4A, 4B and 4C, the high voltage MOS device 400 is formed on the semiconductor substrate 11 having a top surface 11' and a bottom surface 11" that is opposite to the top surface 11' in the vertical direction (as indicated by the direction of the dashed arrow in FIG. 4B). The high voltage MOS device 400 includes a well region 12, an isolation oxide region 13, a drift region 14, a gate 15, a source 16, a drain 16', a deep well region 38, and plural buried columns 49.

Still referring to FIGS. 4A, 4B, and 4C, the well region 12 which has a first conductivity type is formed in the semiconductor substrate 11; the well region 12 is located beneath the top surface 11' and connects the top surface 11' in the vertical direction. The isolation oxide region 13 is formed on the top surface 11' for defining an operation region 13a of the high voltage MOS device 400. The drift region 14 which has a second conductivity type is located beneath the top surface 11' and connects the top surface 11'; the drift region 14 is located completely in the well region 12 in the vertical direction, and the drift region 14 connects the well region 12 in the lateral direction (as indicated by the direction of the solid arrow in FIG. 4B) and in the vertical direction. The gate 15 is formed on the top surface 11', wherein a part of the gate 15 is stacked on and contacts part of the well region 12, and another part of the gate 15 is stacked on and contacts part of the drift region 14 in the vertical direction. Note that the channel region of the high voltage MOS device 400 is the portion of the well region 12 below the gate 15. The source 16 which has a second conductivity type is formed beneath the top surface 11' and contacts the top surface 11' in the vertical direction; the source 16 contacts the well region 12 in the lateral direction, and is located beneath a first side S1 of the gate 15 and contacts a portion of the gate 15 (the spacer layer in this embodiment). The drain 16' which has a second conductivity type is formed beneath the top surface 11' and contacts the top surface 11' in the vertical direction, and the drain 16' contacts the drift region 14 in the lateral direction. The drain 16' and the source 16 are separated by the well region 12 and the drift region 14. The drain 16' is located outside of a second side S2 of the gate 15 and is away from the second side S2 of the gate 15 by a distance in the lateral direction; the drain 16' and the source 16 are at different sides of the gate 15 in the lateral direction.

Still referring to FIGS. 4A, 4B and 4C, the deep well region 38 which has a first conductivity type is formed beneath the well region 12 and the drift region 14; the deep well region 38 connects the well region 12, and the deep well region 38 connects the buried columns 49 in the vertical direction. The buried columns 39 which have a first conductivity type are formed at locations below the top surface 11' by a predetermined distance d and do not contact with the top surface 11' in the vertical direction. As shown in the figures, at least a part of every buried column 49 is surrounded by the drift region 14 so that the buried columns 49 and the drift region 14 are arranged in an alternating manner. In a preferable embodiment, the predetermined distance d is longer than 0.1 micrometer (µm).

This embodiment differs from the first embodiment in that, first, the buried columns 39 of the first embodiment are arranged in parallel in the lateral direction, and the buried columns 49 of the present embodiment are arranged in parallel in the width direction (the direction of the dashed arrow in FIGS. 4A and 4C). Second, compared to the high voltage MOS device 300, the high voltage MOS device 400 of the present embodiment further includes the deep well region 38 which are electrically connected with the buried columns 49 to bias the buried columns 49. In a preferable embodiment, the buried columns 49 and the drift region 14 between the well region 12 and the drain 16' are completely depleted during OFF operation of the device.

FIGS. 5A-5C show a third embodiment of the present invention. FIGS. 5A-5C are respectively a top view, a cross-section view (FIG. 5B corresponds to the cross-section line A-A' in FIG. 5A) and a perspective view of an embodiment of the high voltage metal oxide semiconductor device according to the present invention (high voltage MOS device 500). As shown in FIGS. 5A, 5B, and 5C, the high voltage MOS device 500 is formed on the semiconductor substrate 11 having a top surface 11' and a bottom surface 11" that is opposite to the top surface 11' in the in the vertical direction (as indicated by the direction of the dashed arrow in FIG. 5B). The high voltage MOS device 500 includes a drift well region 22, an isolation oxide region 13, a body region 24, a gate 15, a source 16, a drain 16', a body electrode 27, a deep well region 38, and plural buried columns 39.

Still referring to FIGS. 5A, 5B and 5C, the drift well region 22 which has a second conductivity type is formed in the semiconductor substrate 11; the drift well region 22 is located beneath the top surface 11' and connects the top surface 11' in the vertical direction. The isolation oxide region 13 is formed on the top surface 11' for defining an operation region 13a of the high voltage MOS device 500. The body region 24 which has a first conductivity type is located beneath the top surface 11' and connects the top surface 11'. The body region 24 is located completely in the drift well region 22, and the drift well region 22 connects the body region 24 in the lateral direction (as indicated by the direction of the solid arrow in FIG. 5B) and in the vertical direction. The gate 15 is formed on the top surface 11', wherein a part of the gate 15 is stacked on and contacts a part of the drift well region 22, and another part of the gate 15 is stacked on and contacts a part of the body region 24 in the vertical direction. Note that the channel region of the high voltage MOS device 500 is the portion of the body region 24 below the gate 15. The source 16 which has a second conductivity type is formed beneath the top surface 11' and contacts the top surface 11' in the vertical direction; the source 16 contacts the body region 24 in the lateral direction, and is located beneath a first side S1 of the gate 15 and contacts a portion of the gate 15 (the spacer layer in this embodiment). The drain 16' which has a second conductivity type is formed beneath the top surface 11' and contacts the top surface 11' in the vertical direction, and the drain 16' contacts the drift well region 22 in the lateral direction. The drain 16' and the source 16 are separated by the drift well region 22 and the body region 24. The drain 16' is located outside of a second side S2 of the gate 15 and is away from the second side S2 of the gate 15 by a distance in the lateral direction; the drain 16' and the source 16 are at different sides of the gate 15 in the lateral direction.

Still referring to FIGS. 5A, 5B, and 5C, the deep well region 38 which has a first conductivity type is formed beneath the drift well region 22 and the body region 24; the deep well region 38 connects the drift well region 22 in the vertical direction, and the deep well region 38 connects the buried columns 39 in the vertical direction. The buried columns 39 which have a first conductivity type are formed at locations below the top surface 11' by a predetermined distance d and do not contact with the top surface 11' in the vertical direction. As shown in the figures, at least a part of every buried column 39 is surrounded by the drift well region 22 so that the buried columns 39 and the drift well region 22 are arranged in an alternating manner. Preferably, the buried columns 39 are electrically connected to and in contact with the deep well region 38, or the buried columns 39 are biased by the deep well region 38. In a preferable embodiment, the predetermined distance d is longer than 0.1 micrometer (μm). In a preferable embodiment, the buried columns 39 and the drift well region 22 between the body region 24 and the drain 16' are completely depleted during OFF operation of the device. The body electrode 27 which has a first conductivity type is formed beneath the top surface 11' and connects the top surface 11' in the vertical direction; the body electrode 27 connects the body region 24 so as to serve as an electrical contact for the body region 24.

This embodiment differs from the first embodiment in that, first, the first embodiment has a well region 12 and a drift region 14, and the drift region 14 is located completely in the well region 12, but in the present embodiment, the body region 24 is located completely in drift well region 22. Second, compared to the high voltage MOS device 300, the high voltage MOS device 500 of the present embodiment further includes a deep well region 38 which are electrically connected with the buried columns 39 to bias the buried columns 39.

FIGS. 6A and 6B show a fourth embodiment of the present invention. FIGS. 6A and 6B are respectively a top view and a cross-section view (FIG. 6B corresponds to the cross-section line A-A' in FIG. 6A) of an embodiment of a high voltage metal oxide semiconductor device according to the present invention (high voltage MOS device 600). As shown in FIGS. 6A and 6B, the high voltage MOS device 600 is formed on the semiconductor substrate 11 having a top surface 11' and a bottom surface 11" that is opposite to the top surface 11' in the vertical direction (as indicated by the direction of the dashed arrow in FIG. 6B). The high voltage MOS device 600 includes a drift well region 22, an isolation oxide region 13, a body region 24, a gate 15, a source 16, a drain 16', a body electrode 27, and plural buried columns 39.

Still referring to FIGS. 6A and 6B, the drift well region 22 which has a second conductivity type is formed in the semiconductor substrate 11; the drift well region 22 is located beneath the top surface 11' and connects the top surface 11' in the vertical direction. The isolation oxide region 13 is formed on the top surface 11' for defining an operation region 13a of the high voltage MOS device 600. The body region 24 which has a first conductivity type is located beneath the top surface 11' and connects the top surface 11'. The body region 24 is located completely in the drift well region 22, and the drift well region 22 connects the body region 24 in the lateral direction (as shown in the solid line arrow direction in FIG. 6B) and in the vertical direction. The gate 15 is formed on the top surface 11', wherein a part of the gate 15 is stacked on and contacts a part of the drift well region 22, and another part of the gate 15 is stacked on and contacts a part of the body region 24 in the vertical direction. Note that the channel region of the high voltage MOS device 600 is the portion of the body region 24 below the gate 15. The source 16 which has a second conductivity type is formed beneath the top surface 11' and contacts the top surface 11' in the vertical direction; the source 16 contacts the body region 24 in the lateral direction, and is located beneath a first side S1 of the gate 15 and contacts a portion of the gate 15 (the spacer layer in this embodiment). The drain 16' which has a second conductivity type is formed beneath the top surface 11' and contacts the top surface 11' in the vertical direction, and the drain 16' contacts the drift well region 22 in the lateral direction. The drain 16' and the source 16 are separated by the drift well region 22 and the body region 24. The drain 16' is located outside of a second side S2 of the gate 15 and is away from the second side S2 of the gate 15 by a distance in the lateral direction; the drain 16' and the source 16 are at different sides of the gate 15 in the lateral direction.

Still referring to FIGS. 6A and 6B, the buried columns 49 which have a first conductivity type are formed at locations below the top surface 11' by a predetermined distance d and do not contact with the top surface 11' in the vertical direction. As shown in the figures, at least a part of every buried column 49 is surrounded by the drift well region 22 so that the buried columns 49 and the drift well region 22 are arranged in an alternating manner. Preferably, the buried columns 49 is electrically connected to and in contact with the body region 24, or the buried columns 49 are biased by the body region 24. In a preferable embodiment, the predetermined distance d is longer than 0.1 micrometer (μm). In a preferable embodiment, the buried columns 49 and the drift well region 22 between the body region 24 and the drain 16' are completely depleted during OFF operation of the device. The body electrode 27 which has a first conductivity type is formed beneath the top surface 11' and connects the top surface 11' in the vertical direction; the body electrode 27 connects the body region 24 so as to serve as an electrical contact for the body region 24.

The present embodiment differs from the third embodiment in that, first, the third embodiment has the deep well region 38, but in the present embodiment, the high voltage MOS device 600 does not include the deep well region. Second, in the present embodiment, compared with the high voltage MOS device 500, the body region 24 of the high voltage MOS device 600 connects the buried columns 49 in the lateral direction so that the body region 24 is electrically connected to the buried columns 49 to bias the buried columns 49. Furthermore, the buried columns 39 of the third embodiment are arranged in parallel in the lateral direction, but the buried columns 49 in the present embodiment are arranged in parallel in the width direction.

FIGS. 7A and 7B show a fifth embodiment of the present invention. FIGS. 7A and 7B are respectively a top view and a cross-section view (FIG. 7B corresponds to the cross-section line A-A' in FIG. 7A) of an embodiment of a high voltage metal oxide semiconductor device according to the present invention (high voltage MOS device 700). As shown in FIGS. 7A and 7B, the high voltage MOS device 700 is formed on the semiconductor substrate 11 having a top surface 11' and a bottom surface 11" that is opposite the top surface 11' in the vertical direction (as indicated by the direction of the dashed arrow in FIG. 7B). The high voltage MOS device 700 includes a drift well region 22, an isolation oxide region 13, a body region 24, a gate 15, a source 16, a drain 16', a body electrode 27, a deep well region 38, and plural buried columns 49.

Still referring to FIGS. 7A and 7B, the deep well region 38 which has a first conductivity type is formed beneath the drift well region 22 and the body region 24; the deep well region 38 connects the drift well region 22 in the vertical direction, and the deep well region 38 connects the buried columns 49 in the vertical direction. The drift well region 22 which has a second conductivity type is formed in the semiconductor substrate 11; the drift well region 22 is located beneath the top surface 11' and connects the top surface 11' in the vertical direction. The isolation oxide region 13 is formed on the top surface 11' for defining an operation region 13a of the high voltage MOS device 700. The body region 24 which has a first conductivity type is located beneath the top surface 11' and connects the top surface 11'. The body region 24 is located completely in the drift well region 22, and the drift well region 22 connects the body region 24 in the lateral direction (as shown in the solid line arrow direction in FIG. 7B) and in the vertical direction. The gate 15 is formed on the top surface 11', wherein a part of the gate 15 is stacked on and contacts a part of the drift well region 22, and another part of the gate 15 is stacked on and contacts a part of the body region 24 in the vertical direction. Note that the channel region of the high voltage MOS device 700 is the portion of the body region 24 below the gate 15. The source 16 which has a second conductivity type is formed beneath the top surface 11' and contacts the top surface 11' in the vertical direction; the source 16 contacts the body region 24 in the lateral direction, and is located beneath a first side S1 of the gate 15 and contacts a portion of the gate 15 (the spacer layer in this embodiment). The drain 16' which has a second conductivity type is formed beneath the top surface 11' and contacts the top surface 11' in the vertical direction, and the drain 16' contacts the drift well region 22 in the lateral direction. The drain 16' and the source 16 are separated by the drift well region 22 and the body region 24. The drain 16' is located outside of a second side S2 of the gate 15 and is away from the second side S2 of the gate 15 by a distance in the lateral direction; the drain 16' and the source 16 are at different sides of the gate 15 in the lateral direction.

Still referring to FIGS. 7A and 7B, the deep well region 38 which has a first conductivity type is formed beneath the drift well region 22 and the body region 24; the deep well region 38 connects the drift well region 22 in the vertical direction, and the deep well region 38 connects the buried columns 49 in the vertical direction. The buried columns 49 which have a first conductivity type are formed at locations below the top surface 11' by a predetermined distance d and do not contact with the top surface 11' in the vertical direction. As shown in the figures, at least a part of every buried column 49 is surrounded by the drift well region 22 so that the buried columns 49 and the drift well region 22 are arranged in an alternating manner. Preferably, the buried columns 49 is electrically connected to and in contact with the deep well region 38, or the buried columns 49 are biased by the deep well region 38. In a preferable embodiment, the predetermined distance d is longer than 0.1 micrometer (μm). In a preferable embodiment, the buried columns 49 and the drift well region 22 between the body region 24 and the drain 16' are completely depleted during OFF operation of the device. The body electrode 27 which has a first conductivity type is formed beneath the top surface 11' and connects the top surface 11' in the vertical direction; the body electrode 27 connects the body region 24 so as to serve as an electrical contact for the body region 24.

This embodiment differs from the third embodiment in that the buried columns 39 of the third embodiment are arranged in parallel in the lateral direction, but the buried columns 49 in the present embodiment are arranged in parallel in the width direction.

FIGS. 8A and 8B show a sixth embodiment of the present invention. FIGS. 8A and 8B are respectively a top view and a cross-section view (FIG. 8B corresponds to the cross-section line A-A' in FIG. 8A) of an embodiment of a high voltage metal oxide semiconductor device according to the present invention (high voltage MOS device 800). As shown in FIGS. 8A and 8B, the high voltage MOS device 800 is formed on the semiconductor substrate 11 having a top surface 11' and a bottom surface 11" that is opposite to the top surface in the vertical direction (as indicated by the direction of the dashed arrow in FIG. 8B). The high voltage MOS device 800 includes a drift well region 22, an isolation oxide region 13, a field oxide region 13', a body region 24, a gate 25, a source 16, a drain 16', a body electrode 27, and plural buried columns 49.

Still referring to FIGS. 8A and 8B, the drift well region 22 which has a second conductivity type is formed in the semiconductor substrate 11; the drift well region 22 is located beneath the top surface 11' and connects the top surface 11' in the vertical direction. The isolation oxide region 13 is formed on the top surface 11' for defining an operation region 13a of the high voltage MOS device 800. The field oxide region 13' is formed on the top surface 11', wherein a part of the gate 25 is stacked on and connects at least a part of the field oxide region 13' in the vertical direction. The body region 24 which has a first conductivity type is located beneath the top surface 11' and connects the top surface 11'; the body region 24 is located completely in the drift well region 22, and the drift well region 22 connects the body region 24 in the lateral direction (as indicated by the direction of the solid arrow in FIG. 8B) and in the vertical direction. The gate 25 is formed on the top surface 11'; besides the part of the gate 25 which is stacked on the field oxide region 13', another part of the gate 25 is stacked on and contacts a part of the drift well region 22, and another part of the gate 25 is stacked on and contacts a part of the body region 24 in the vertical direction. Note that the channel region of the high voltage MOS device 800 is the portion of the body region 24 below the gate 25. The source 16 which has a second conductivity type is formed beneath the top surface 11' and contacts the top surface 11' in the vertical direction; the source 16 contacts the body region 24 in the lateral direction, and is located beneath a first side S1 of the gate 15 and contacts a portion of the gate 15 (the spacer layer in this embodiment). The drain 16' which has a second conductivity type is formed beneath the top surface 11' and contacts the top surface 11' in the vertical direction, and the drain 16' contacts the drift well region 22 in the lateral direction. The drain 16' and the source 16 are separated by the drift well region 22 and the body region 24. The drain 16' is located outside of a second side S2 of the gate 25 and is away from the second side S2 of the gate 25 by a distance in the lateral direction; the drain 16' and the source 16 are at different sides of the gate 25 in the lateral direction.

Still referring to FIGS. 8A and 8B, the buried columns 49 have a first conductivity type formed below the top surface 11' by a predetermined distance d and do not contact with the top surface 11' (the top surface 11' indicated by the thick black dashed line in FIG. 8B) in the vertical direction. As shown in the figures, at least a part of every buried column 49 is surrounded by the drift well region 22 so that the buried columns 49 and the drift well region 22 are arranged in an alternating manner. In a preferable embodiment, the buried columns 49 is electrically connected to and in contact with the body region 24, or the buried columns 49 are biased by the body region 24. In a preferable embodiment, the predetermined distance d is longer than 0.1 micrometer (μm) In a preferable embodiment, the buried columns 49 and the drift well region 22 between the body region 24 and the drain 16' are completely depleted during OFF operation of the device. The body electrode 27 which has a first conductivity type is formed beneath the top surface 11' and connects the top surface 11' in the vertical direction; the body electrode 27 connects the body region 24 so as to serve as an electrical contact for the body region 24.

This embodiment differs from the fourth embodiment in that, first, compared to the third embodiment, the high voltage MOS device 800 of the present embodiment further includes the field oxide region 13'. Second, in the high voltage MOS device 800 of the present embodiment, a part of the gate 25 is stacked on and connects a part of the field oxide region 13'.

FIGS. 9A and 9B show a seventh embodiment of the present invention. FIGS. 9A and 9B are respectively a top view and a cross-section view (FIG. 9B corresponds to the cross-section line A-A' in FIG. 9A) of an embodiment of a high voltage metal oxide semiconductor device according to the present invention (high voltage MOS device 900). As shown in FIGS. 9A and 9B, the high voltage MOS device 900 is formed on the semiconductor substrate 11 and the semiconductor substrate 11 has a top surface 11' and a bottom surface 11 that is opposite to the top surface 11' in the vertical direction (as indicated by the direction of the dashed arrow in FIG. 9B). The high voltage MOS device 900 includes: a drift well region 22, an isolation oxide region 13, a field oxide region 13', a body region 24, a gate electrode 25, a source electrode 16, a drain 16', a body electrode 27, a deep well region 38, and plural buried columns 39.

Still referring to FIGS. 9A and 9B, the deep well region 38 which has a first conductivity type is formed beneath the drift well region 22 and the body region 24; the deep well region 38 connects the drift well region 22 in the vertical direction, and the deep well region 38 connects the buried columns 39 in the vertical direction. The drift well region 22 which has a second conductivity type is formed in the semiconductor substrate 11; the drift well region 22 is located beneath the top surface 11' and connects the top surface 11' in the vertical direction. The isolation oxide region 13 is formed on the top surface 11' for defining an operation region 13a of the high voltage MOS device 900. The field oxide region 13' is formed on the top surface 11', and a part of the gate 25 is stacked on and connects a part of the field oxide regions 13' in the vertical direction. The body region 24 which has a first conductivity type is located beneath the top surface 11' and connects the top surface 11' in the vertical direction. The body region 24 is located completely in the drift well region 22, and the body region 24 connects the drift well region 22 in the lateral direction (as indicated by the direction of the solid arrow in FIG. 9B) and in the vertical direction. The gate 25 is formed on the top surface 11', wherein, besides the part of the gate 25 on the field oxide regions 13', another part of the gate 25 is stacked on and contacts a part of the drift well region 22, and another part of the gate 25 is stacked on and contacts a part of the body region 24 in the vertical direction. Note that the channel region of the high voltage MOS device 900 is the portion of the body region 24 below the gate 25. The source 16 which has a second conductivity type is formed beneath the top surface 11' and contacts the top surface 11' in the vertical direction; the source 16 contacts the body region 24 in the lateral direction, and is located beneath a first side S1 of the gate 15 and contacts a portion of the gate 15 (the spacer layer in this embodiment). The drain 16' which has a second conductivity type is formed beneath the top surface 11' and contacts the top surface 11' in the vertical direction, and the drain 16' contacts the drift well region 22 in the lateral direction. The drain 16' and the source 16 are separated by the drift well region 22 and the body region 24. The drain 16' is located outside of a second side S2 of the gate 25 and is away from the second side S2 of the gate 25 by a distance in the lateral direction; the drain 16' and the source 16 are at different sides of the gate 25 in the lateral direction.

Still referring to FIGS. 9A and 9B, The buried columns 39 which have a first conductivity type are formed at locations below the top surface 11' by a predetermined distance d and do not contact with the top surface 11' in the vertical direction (top surface 11' is illustrated as a thick black dashed line in FIG. 9B). As shown in the figures, at least a part of every buried column 39 is surrounded by the drift well region 22 so that the buried columns 39 and the drift well region 22 are arranged in an alternating manner. Preferably, the buried columns 39 are electrically connected to and in contact with the deep well region 38, or the buried columns 39 are biased by the deep well region 38. In a preferable embodiment, the predetermined distance d is longer than 0.1 micrometer (μm). The body electrode 27 which has a first conductivity type is formed beneath the top surface 11' and connects the top surface 11' in the vertical direction; the body electrode 27 connects the body region 24 so as to serve as an electrical contact for the body region 24.

The present embodiment differs from the high voltage MOS device 800 of the sixth embodiment in that, first, in the present embodiment, the high voltage MOS device 900 further includes a deep well region 38, which is electrically connected to the buried columns 39 to bias the buried columns 39. Second, the buried columns 39 of the present embodiment are arranged in parallel in the lateral direction, while the buried columns 49 of the sixth embodiment are arranged in parallel in the width direction.

FIGS. 10A-10L show an eighth embodiment of the present invention. FIGS. 10A-10L are, respectively, top views and cross-section views showing a method of manufacturing the high voltage MOS device (e.g. high voltage MOS device 300) according to the present invention. First, as shown in the top view in FIG. 10A and the cross-section view in FIG. 10B (FIG. 10B corresponds to the cross-section line A-A' in FIG. 10A), the semiconductor substrate 11 is provided and the well region 12 is formed. The semiconductor substrate 11 is, for example but not limited to, a P-type silicon substrate, but certainly it can be another type of semiconductor substrate. The semiconductor substrate 11 has a top surface 11' and a bottom surface 11" that is opposite to the top surface in a vertical direction (the direction of a dashed arrow in FIG. 10B). The well region 12 which has a first conductivity type is formed in the semiconductor substrate 11; the well region 12 is located beneath the top surface 11' and connects the top surface 11' in the vertical direction. The well region 12 may be formed by, for example but not limited to, an ion implantation process step.

Figure 10A:
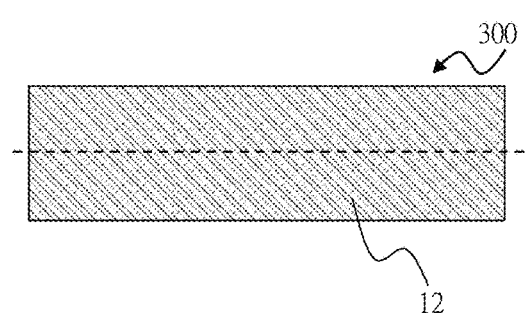
Figure 10B:
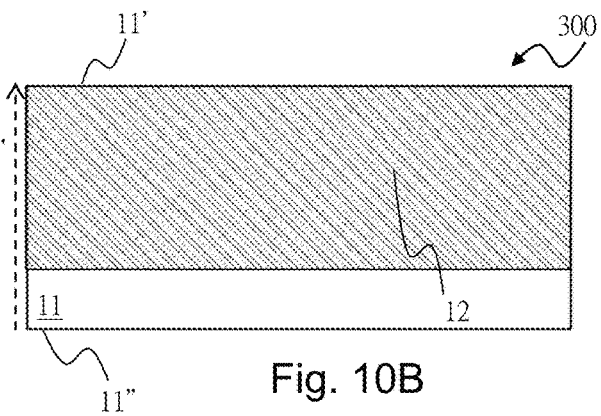
Figure 10C:
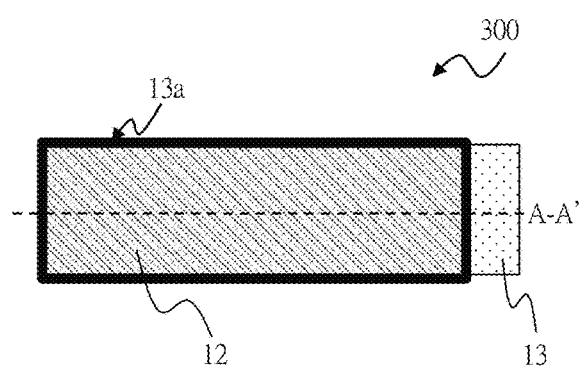
Figure 10D:
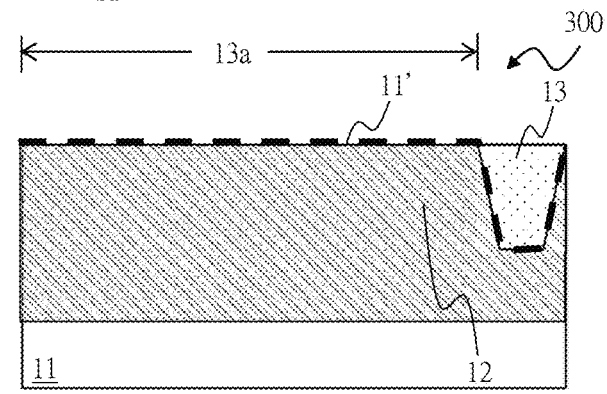

Next, as shown in the top view of FIG. 10C and the cross-section view of FIG. 10D (FIG. 10D corresponds to the cross-section line A-A' in FIG. 10C), the isolation oxide region 13 is formed on the top surface 11' (the top surface 11' is illustrated by a thick black dashed line in FIG. 10D) for defining an operation region 13a of the high voltage MOS device 300).

Figure 10E:
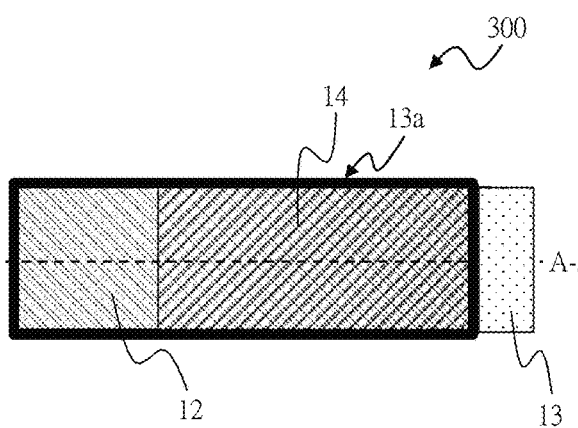
Figure 10F:
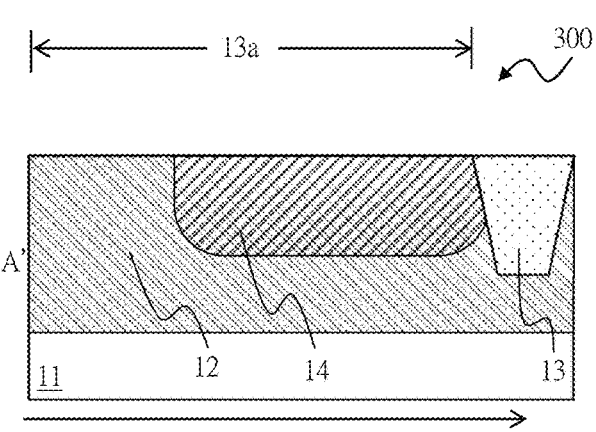

Next, as shown in the top view of FIG. 10E and the cross-section view of FIG. 10F (FIG. 10F corresponds to the cross-section line A-A' in FIG. 10E), the drift region 14 is formed beneath the top surface 11' and connects the top surface 11'. The drift region 14 has a second conductivity type. The drift region 14 is located completely in the well region 12, and the drift region 14 connects the well region 12 in the lateral direction (as indicated by the direction of the solid arrow in FIG. 10F) and in the vertical direction. The drift region 14 for example may be formed by processes including a lithography process, an ion implantation process, and a thermal process, which is known to a person having ordinary skill in the art, so the details thereof are not redundantly explained here.

Next, as shown in the top view of FIG. 10G and the cross-section view of FIG. 10H (FIG. 10H corresponds to the cross-section line A-A' in FIG. 10G), the buried columns 39 are formed beneath the top surface 11' by a predetermined distance d; the buried columns 39 are not in contact with the top surface 11'. The buried columns 39 have a first conductivity type. At least a part of every buried column 39 is surrounded by the drift region 14 so that the buried columns 39 and the drift region 14 are arranged in an alternating manner. The buried columns 39 for example may be formed by processes including a lithography process, an ion implantation process, and a thermal process, which is known to a person having ordinary skill in the art, so the details thereof are not redundantly explained here. In a preferable embodiment, the buried columns 39 and the drift region 14 between the well region 12 and the drain 16' are completely depleted during OFF operation of the device. Note that the buried columns 39 can be formed by various ways. For example, in the ion implantation process step, the depth of the ion implantation may be set to control the predetermined distance d; or in the next steps. And/or, another ion implantation process of opposite conductivity type (the second conductivity type in this example) may be performed to implant impurities of the second conductivity type to the range of the predetermined distance d, so that the range of the predetermined distance d does not have the first conductivity type.

Next, as shown in the top view of FIG. 10I and the cross-section view of FIG. 10J (FIG. 10J corresponds to the cross-section line A-A' in FIG. 10I), the gate 15 is formed on the top surface 11', wherein a part of the gate 15 is stacked on and contacts a part of the well region 12, and another part of the gate 15 is stacked on and contacts a part of the drift region 14 in the vertical direction. Note that the channel region of the high voltage MOS device 300 is the portion of the well region 12 below the gate 15. The gate 15 includes a dielectric layer, a conductor layer, and a spacer layer, which is known to a person having ordinary skill in the art, so the details thereof are not redundantly explained here.

Next, the source 16 and the drain 16' are formed as shown in the top view of FIG. 10K and the cross-section view of FIG. 10L (FIG. 10L corresponds to the cross-section line A-A' in FIG. 10K). The source 16 has a second conductivity type; the source 16 is formed beneath the top surface 11' and contacts the top surface 11' in the vertical direction, and the source 16 contacts the well region 12 in the lateral direction. The source 16 is located beneath a first side S1 of the gate 15 and contacts a portion of the gate 15 (the spacer layer in this embodiment). The drain 16' has a second conductivity type; the drain 16' is formed beneath the top surface 11' and contacts the top surface 11' in the vertical direction, and the drain 16' contacts the drift region 14 in the lateral direction. The drain 16' and the source 16 are separated by the well region 12 and the drift region 14. The drain 16' is located outside of a second side S2 of the gate 15 and is away from the second side S2 of the gate 15 by a distance in the lateral direction; the drain 16' and the source 16 are at different sides of the gate 15 in the lateral direction. The source 16 and the drain 16' for example may be formed by processes including a lithography process, an ion implantation process, and a thermal process, which is known to a person having ordinary skill in the art so the details thereof are not redundantly explained here. In a preferable embodiment, the buried columns 39 are electrically connect to and in contact with the well region 12, or the buried columns 39 are biased by the well region 12. In a preferable embodiment, the predetermined distance d is longer than 0.1 micrometer (μm).

FIGS. 11A-11L show a ninth embodiment of the present invention. FIGS. 11A-11L are, respectively, top views and cross-section views showing a manufacturing method of a high voltage MOS device (e.g. high voltage MOS device 1100) according to the present invention. First, as shown in the top view of FIG. 11A and the cross-section view of FIG. 11B (FIG. 11B corresponds to the cross-section line A-A' of FIG. 11A), the semiconductor substrate 11 is provided and the deep well region 38 and the drift well region 22 are formed therein. The semiconductor substrate 11 is, for example but not limited to, a P-type silicon substrate, but of course, it may be another type of semiconductor substrate. The semiconductor substrate 11 has a top surface 11' and a bottom surface 11" that is opposite to the top surface in a vertical direction (the direction of a dotted arrow in the figure). The deep well region 38 has a first conductivity type; the deep well region 38 is formed under the drift well region 22 in the vertical direction and also under the body region 24 which is to be formed by subsequent steps. The deep well region 38 and connects the drift well region 22 in the vertical direction, and the deep well region 38 connects the buried columns 39 which are to be formed by subsequent steps. The drift well region 22, which has a second conductivity type, is formed in the semiconductor substrate 11, and located beneath the top surface 11' and connects the top surface 11' in the vertical direction. The drift well region 22 and the deep well region 38 for example may be formed by an ion implantation process step.

Figure 11A:
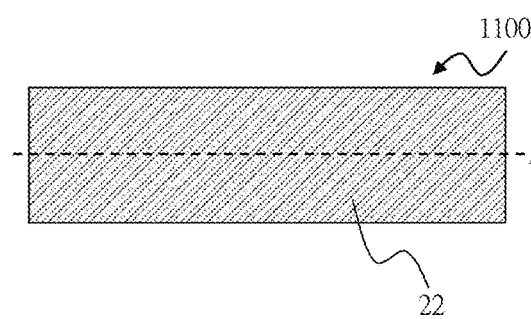
FIGS. 11A to 11L show a ninth embodiment of the present invention.
Figure 11B:
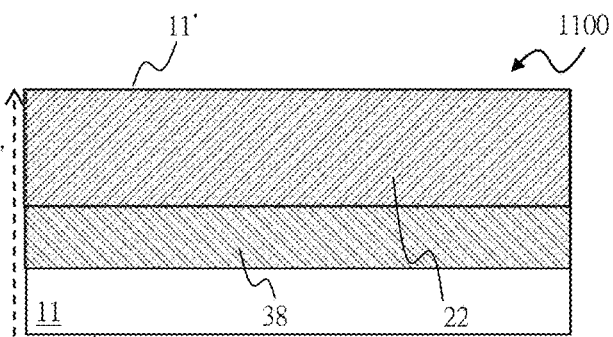
Figure 11C:
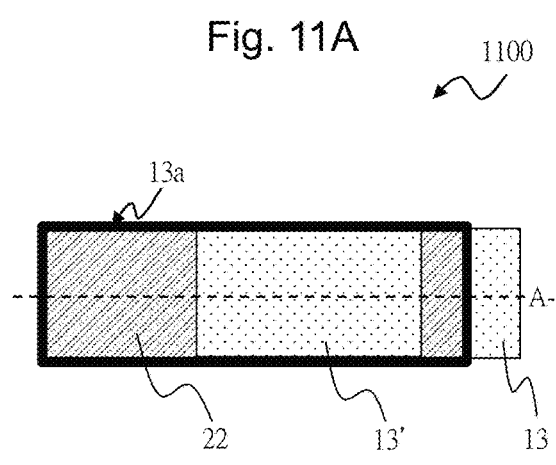
Figure 11D:
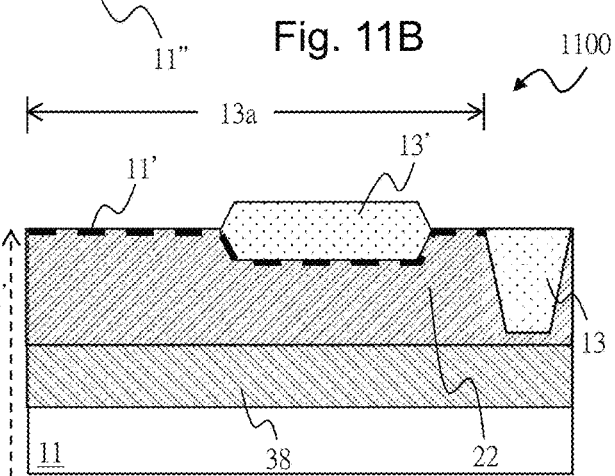

Next, the isolation oxide region 13 and the field oxide region 13' are formed on the top surface 11' (the top surface 11' is as indicated by the thick black dashed line in FIG. 11D) as shown in the top view of FIG. 11C and the cross-section view of FIG. 11D (FIG. 11D corresponds to the cross-section line A-A' in FIG. 11C). The isolation oxide region 13 is for defining an operation region 13a of the high voltage MOS device 1100. A part of the gate 25 which is to be formed by subsequent steps is stacked on and connects a part of the field oxide region 13'.

Figure 11E:
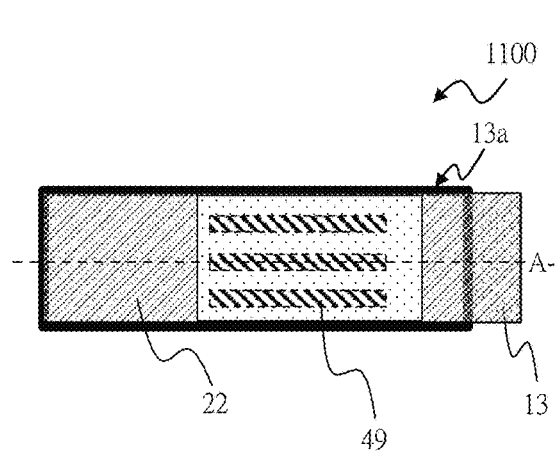
Figure 11F:
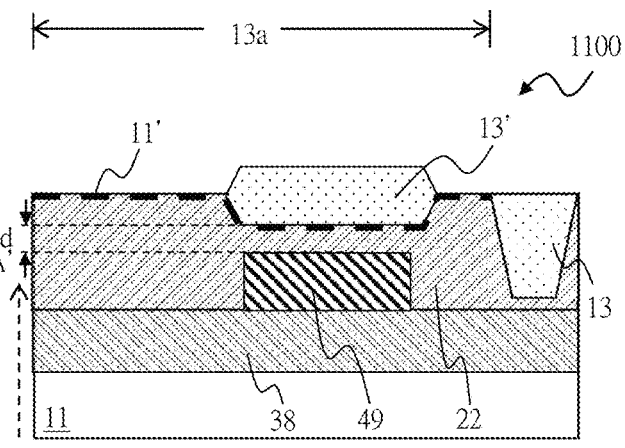

Next, as shown in the top view of FIG. 11E and the cross-section view of FIG. 11F (FIG. 11F corresponds to the cross-section line A-A' in FIG. 11E), the buried columns 49 are formed beneath the top surface 11' by a predetermined distance d, and the buried columns 49 are not in contact with the top surface 11'. The buried columns 49 have a first conductivity type. At least a part of every buried column 49 is surrounded by the drift well region 22 so that the buried columns 49 and the drift well region 22 are arranged in an alternating manner. In a preferable embodiment, the buried columns 49 are electrically connected to and in contact with the deep well region 38, or the buried columns 49 are biased by the deep well region 38. In a preferable embodiment, the predetermined distance d is longer than 0.1 micrometer (μm). In a preferable embodiment, the buried columns 49 and the drift well region 22 between the body region 24 and the drain 16' are completely depleted during OFF operation of the device. The buried columns 49 for example may be formed by processes including a lithography process, an ion implantation process, and a thermal process, which is known to a person having ordinary skill in the art, so the details thereof are not redundantly explained here. Note that the buried columns 49 can be formed by various ways. For example, in the ion implantation process step, the depth of the ion implantation may be set to control the predetermined distance d; or in the next steps. And/or, another ion implantation process of opposite conductivity type (the second conductivity type in this example) may be performed to implant impurities of the second conductivity type to the range of the predetermined distance d, so that the range of the predetermined distance d does not have the first conductivity type. Note that the buried columns 49 of the present embodiment are arranged in parallel in the width direction, and the buried columns 49 connect the deep well region 38.

Figure 11G:
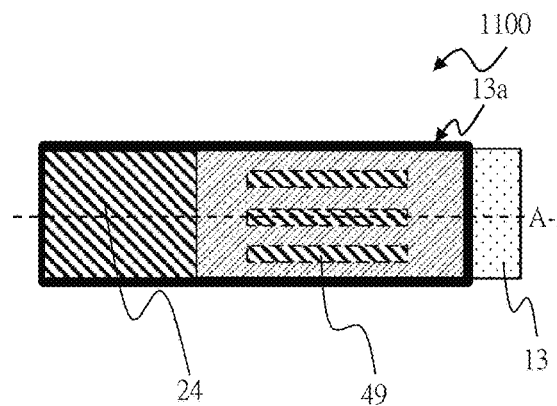
Figure 11H:
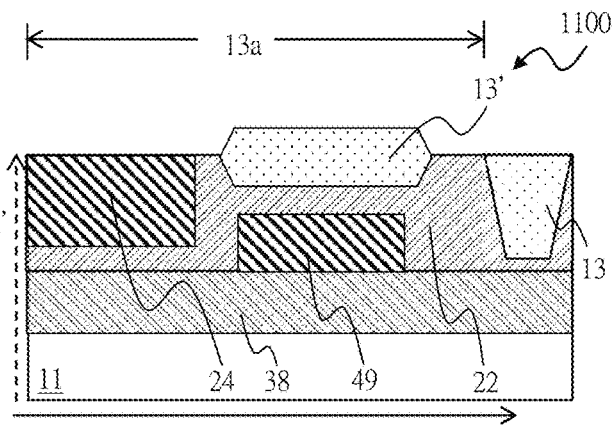

Next, as shown in the top view of FIG. 11G and the cross-section view of FIG. 11H (FIG. 11H corresponds to the cross-section line A-A' in FIG. 11G), the body region 24, which has the first conductive type, is formed beneath the top surface 11' and connects the top surface 11', wherein the body region 24 is located completely in the drift well region 22 in the vertical direction, and the drift well region 22 connects the body region 24 in the lateral direction (as indicated by the direction of the solid arrow in FIG. 11H).

Figure 11I:
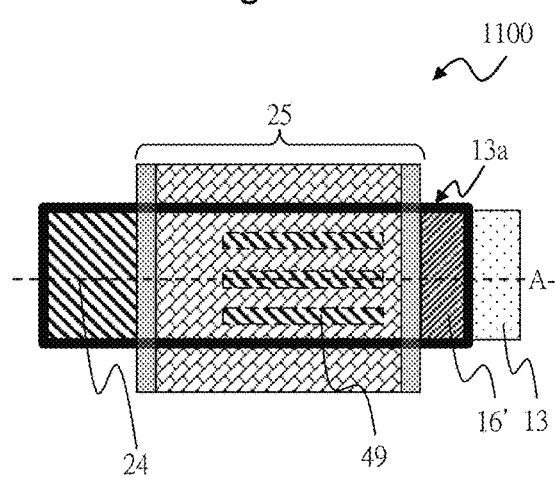
Figure 11J:
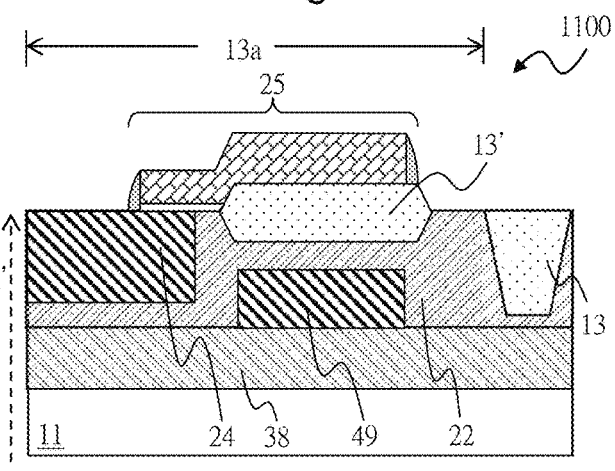

Next, as shown in the top view of FIG. 11I and the cross-section view of FIG. 11J (FIG. 11J corresponds to the cross-section line A-A' of the top view 11I), the gate 25 is formed on the top surface 11', wherein a part of the gate 25 is stacked on and contacts a part of the body region 24, and another part of the gate 25 is stacked on and contacts a part of the body region 24 in the vertical direction. Note that the channel region of the high voltage MOS device 1100 is the portion of the body region 24 below the gate 15. The gate 25 includes a dielectric layer, a conductor layer, and a spacer layer, which is known to a person having ordinary skill in the art, so the details thereof are not redundantly explained here.

Figure 11K:
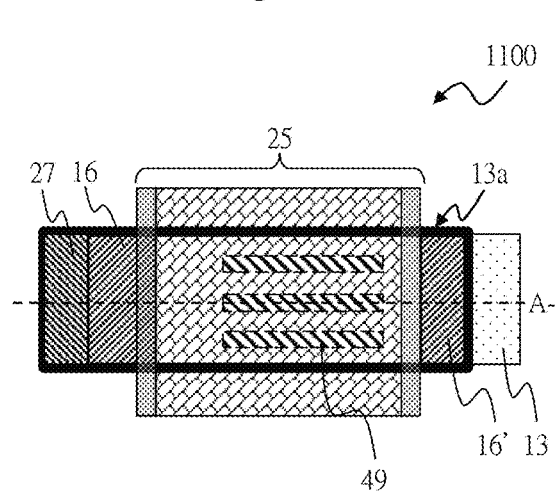
Figure 11L:
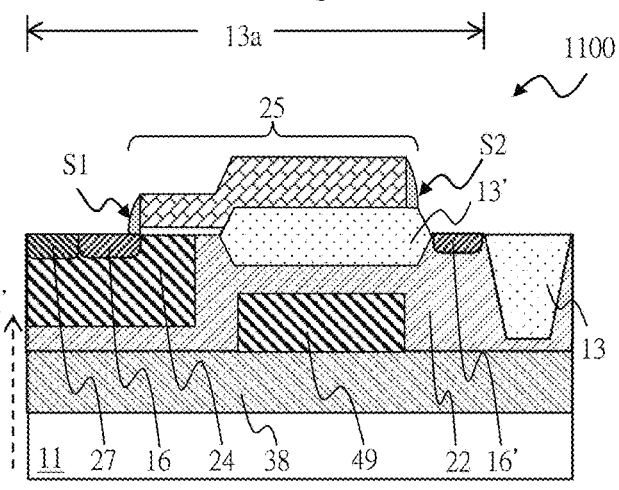

Next, the source 16, the drain 16' and the body electrode 27 are formed as shown in the top view of FIG. 11K and a cross-section view of FIG. 11L (FIG. 11L corresponds to the cross-section line A-A' in FIG. 11K). The source 16 has a second conductivity type, which is formed beneath the top surface 11' and contacts the top surface 11' in the vertical direction, and the source 16 contacts the body region 24 in the lateral direction. The source 16 is located beneath a first side S1 of the gate 15 and contacts a portion of the gate 15 (the spacer layer in this embodiment). The drain 16' has a second conductivity type; the drain 16' is formed beneath the top surface 11' and contacts the top surface 11' in the vertical direction, and the drain 16' contacts the drift well region 22 in the lateral direction. The drain 16' and the source 16 are separated by the body region 24 and the drift well region 22. The drain 16' is located outside of a second side S2 of the gate 15 and is away from the second side S2 of the gate 15 by a distance in the lateral direction; the drain 16' and the source 16 are at different sides of the gate 15 in the lateral direction. The body electrode 27 which has a first conductivity type is formed beneath the top surface 11' and connects the top surface 11' in the vertical direction; the body electrode 27 connects the body region 24 so as to serve as an electrical contact for the body region 24. The source 16, the drain 16' and the body electrode 27 for example may be formed by processes including a lithography process, an ion implantation process, and a thermal process, which is known to a person having ordinary skill in the art, so the details thereof are not redundantly explained here.

The present invention has been described in considerable detail with reference to certain preferred embodiments thereof. It should be understood that the description is for illustrative purpose, not for limiting the scope of the present invention. The various embodiments described above are not limited to being used alone; two embodiments may be used in combination. Those skilled in this art can readily conceive variations and modifications within the spirit of the present invention. For example, other process steps or structures, such as a threshold voltage adjustment region, a high voltage well region, or a buried layer, may be added. For another example, the buried columns may have other shapes instead of the rectangular plate shape shown in the embodiments, as long as, when a reversed bias is formed between the buried columns and the well region or between the buried columns drift well region, a super junction is formed to increase the breakdown voltage, and as long as, the upper edge of the buried columns is away from the top surface of the semiconductor substrate by a predetermined distance, so that the buried columns do not significantly affect the conduction current when the high voltage MOS device is ON. Therefore, in the same spirit of the present invention, those skilled in the art can think of various variations, which should be included in the scope of the present invention.

What is claimed is:

1. A high voltage metal oxide semiconductor (MOS) device formed on a semiconductor substrate having a top surface and a bottom surface that is opposite to the top surface in a vertical direction, the high voltage MOS device comprising:
 a well region having a first conductivity type, wherein the well region is formed beneath the top surface, and connects the top surface in the vertical direction;
 a drift region having a second conductivity type, wherein the drift region is formed beneath the top surface and connects the top surface in the vertical direction, the drift region being located completely in the well region, and the drift region connecting the well region in a lateral direction and in the vertical direction;
 a gate formed on the top surface, wherein a part of the gate is stacked on and connects a part of the well region in the vertical direction, and another part of the gate is stacked on and connects a part of the drift region in the vertical direction;
 a source having the second conductivity type, wherein the source is formed beneath the top surface and contacts the top surface in the vertical direction, and the source contacts the well region in the lateral direction, the source being located beneath a first side of the gate and contacts a portion of the gate;
 a drain having the second conductivity type, wherein the drain is formed beneath the top surface and contacts the top surface in the vertical direction and contacts the well region in the lateral direction, and wherein the drain and the source are separated by the well and the drift region, the drain being located away from a second side of the gate by a lateral distance, and the drain and the source are located at different sides of the gate in the lateral direction;

a plurality of buried columns having the second conductivity type, wherein the buried columns are formed beneath the top surface by a predetermined distance and do not contact with the top surface, and wherein at least a part of every buried column is surrounded by the drift region so that the buried columns and the drift region are arranged in an alternating manner.

2. The high voltage MOS device of claim 1, further including: a deep well region having the first conductivity type, the deep well being formed beneath the well region and the drift region, and the deep well region connects the buried columns in the vertical direction.

3. The high voltage MOS device of claim 1, wherein the buried columns and the drift region between the buried columns are completely depleted during an OFF operation of the high voltage MOS device.

4. The high voltage MOS device of claim 1, wherein the predetermined distance is longer than 0.1 micrometer (μm).

5. A manufacturing method of a high voltage MOS semiconductor device, comprising:
providing a substrate having a top surface and a bottom surface opposite to the top surface in a vertical direction;
forming a well region having a first conductivity type beneath the top surface, wherein the well region connects the top surface;
forming a drift region having a second conductivity type beneath the top surface, wherein the drift region connects the top surface, and the drift region is located completely in the well region and connects the well region in a lateral direction and in the vertical direction;
forming a gate on the top surface, wherein a part of the gate is stacked on and connects a part of the well region and another part of the gate is stacked on and connects a part of the drift region;
forming a source having the second conductivity type beneath the top surface, wherein the source contacts the top surface in the vertical direction and contacts the well region in the lateral direction, the source being located beneath a first side of the gate and contacts a portion of the gate;
forming a drain having the second conductivity type beneath the top surface, wherein the drain contacts the top surface in the vertical direction and contacts the well region in the lateral direction, and wherein the drain and the source are separated by the well and the drift region, the drain being located away from a second side of the gate by a lateral distance, and the drain and the source are located at different sides of the gate in the lateral direction; and
forming a plurality of buried columns having the second conductivity type, wherein the buried columns are formed beneath the top surface by a predetermined distance and do not contact with the top surface, and wherein at least a part of every buried column is surrounded by the drift region so that the buried columns and the drift region are arranged in an alternating manner.

6. The manufacturing method of the high voltage MOS semiconductor device of claim 5, further including: forming a deep well region beneath the well region and the drift region, wherein the deep well region has a first conductivity type and the deep well region connects the buried columns.

7. The manufacturing method of the high voltage MOS semiconductor device of claim 5, wherein the buried columns and the drift region between the buried columns are completely depleted during an OFF operation of the high voltage MOS device.

8. The manufacturing method of the high voltage MOS semiconductor device of claim 5, wherein the predetermined distance is longer than 0.1 micrometer (μm).

9. A high voltage metal oxide semiconductor (MOS) device formed on a semiconductor substrate having a top surface and a bottom surface that is opposite to the top surface in a vertical direction, the high voltage MOS comprising:
a body region having a first conductivity type, wherein the body region is formed beneath the top surface and connects the top surface;
a drift well region having a second conductivity type, wherein the drift well region is formed beneath the top surface and connects the top surface, the body region being located completely in the drift well region and the drift well region connecting the body region in a lateral direction and in the vertical direction;
a gate formed on the top surface, wherein a part of the gate is stacked on and connects a part of the body region in the vertical direction, and another part of the gate is stacked on and connects a part of the drift well region in the vertical direction;
a source having the second conductivity type, wherein the source is formed beneath the top surface and contacts the top surface in the vertical direction, and the source contacts body region in the lateral direction, the source being located beneath a first side of the gate and contacts a portion of the gate;
a drain having the second conductivity type, wherein the drain is formed beneath the top surface and contacts the top surface in the vertical direction, and the drain contacts the drift well region in the lateral direction, the drain and the source being separated by the body region and the drift region, and the drain being located away from a second side of the gate by a lateral distance, wherein the drain and the source are located at different sides of the gate in the lateral direction;
a plurality of buried columns having the first conductivity type, wherein the buried columns are formed beneath the top surface by a predetermined distance and do not contact with the top surface, and wherein at least part of every buried column is surrounded by the drift well region so that the buried columns and the drift region are arranged in an alternating manner; and
a deep well region having the first conductivity type, the deep well region being formed beneath the drift well region, and the deep well region connecting the buried column in the vertical direction.

10. The high voltage MOS device of claim 9, further including a field oxide region formed on the top surface, wherein a part of the gate is stacked on and connects a part of the field oxide region in the vertical direction.

11. The high voltage MOS device of claim 9, further including a body electrode having the first conductivity type, the body electrode being formed beneath the top surface and connecting the top surface and the body region in the vertical direction, wherein the body electrode is provided as an electrical contact for the body region.

12. The high voltage MOS device of claim 9, wherein the buried columns and the drift well region between the buried columns are completely depleted during an OFF operation of the high voltage MOS device.

13. The high voltage MOS device of claim 9, wherein the predetermined distance is longer than 0.1 micrometer (μm).

14. A manufacturing method of a high voltage MOS semiconductor device, comprising:
- providing a substrate having a top surface and a bottom surface opposite to the top surface in a vertical direction;
- forming a body region having a first conductivity type beneath the top surface, wherein the body region connects the top surface;
- forming a drift well region having a second conductivity type beneath the top surface, wherein the drift well region connects the top surface and the body region is located completely in the drift well, the drift well region connecting the body region in a lateral direction and in the vertical direction;
- forming a gate on the top surface, wherein a part of the gate is stacked on and connects a part of the body region and another part of the gate is stacked on and connects a part of the drift well region;
- forming a source having the second conductivity type beneath the top surface, wherein the source contacts the top surface in the vertical direction and contacts the body region in the lateral direction, the source being located beneath a first side of the gate and contacts a portion of the gate;
- forming a drain having the second conductivity type beneath the top surface, wherein the drain contacts the top surface in the vertical direction and contacts the drift well region in the lateral direction, the drain and the source being separated by the body region and the drift region, and the drain being located away from a second side of the gate by a lateral distance, wherein the drain and the source are located at different sides of the gate in the lateral direction;
- forming a plurality of buried columns having the first conductivity type beneath the top surface by a predetermined distance, wherein the buried columns do not contact with the top surface, and wherein at least a part of every buried column is surrounded by the drift well region so that the buried columns and the drift well region are arranged in an alternating manner; and
- forming a deep well region beneath the drift well, wherein the deep well region has a first conductivity type and connects the buried columns.

15. The manufacturing method of the high voltage MOS of claim 14, further including: forming a field oxide region on the top surface, wherein a part of the gate is stacked on and connects a part of the field oxide region.

16. The manufacturing method of the high voltage MOS of claim 14, further including: forming a body electrode, wherein the body electrode is formed beneath the top surface and connects the top surface and the body region, and the body electrode is provided as an electrical contact for the body region.

17. The manufacturing method of the high voltage MOS of claim 14, wherein the buried columns and the drift well region between the buried columns are completely depleted during an OFF operation of the high voltage MOS device.

18. The manufacturing method of the high voltage MOS semiconductor device of claim 14, wherein the predetermined distance is longer than 0.1 micrometer (μm).

* * * * *